(12) United States Patent
Taniguchi et al.

(10) Patent No.: US 6,304,317 B1
(45) Date of Patent: *Oct. 16, 2001

(54) PROJECTION APPARATUS AND METHOD

(75) Inventors: Tetsuo Taniguchi, Kawasaki; Naomasa Shiraishi, Yokohama, both of (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/798,003

(22) Filed: Feb. 12, 1997

Related U.S. Application Data

(63) Continuation-in-part of application No. 08/385,876, filed on Feb. 9, 1995, now Pat. No. 5,610,684, and a continuation-in-part of application No. 08/411,306, filed on Mar. 27, 1995, now Pat. No. 5,677,757, and a continuation-in-part of application No. 08/274,752, filed on Jul. 14, 1994, now Pat. No. 5,448,336.

(30) Foreign Application Priority Data

| Feb. 17, 1994 | (JP) | ...................................... 6-20190 |
| Mar. 29, 1994 | (JP) | ...................................... 6-58932 |
| Jun. 16, 1994 | (JP) | ..................................... 6-134007 |

(51) Int. Cl.$^7$ .......................... G03B 27/52; G03B 27/42; G03B 27/54; G03B 27/72
(52) U.S. Cl. ............................. 355/55; 355/53; 355/67; 355/71
(58) Field of Search ............................ 355/53, 55, 67, 355/69, 71, 77

(56) References Cited

U.S. PATENT DOCUMENTS 4,825,247 * 4/1989 Kemi et al. ............................ 355/55
4,853,756   8/1989 Matsuki ................................. 355/71

(List continued on next page.)

FOREIGN PATENT DOCUMENTS 6-291009   10/1994   (JP) .

Primary Examiner—Russell Adams
Assistant Examiner—Hung Henry Nguyen
(74) Attorney, Agent, or Firm—Armstrong, Westerman, Hattori, McLeland & Naughton, LLP

(57) ABSTRACT

A projection exposure apparatus having an illuminating system for irradiating a mask, which has a pattern, with illuminating light for exposure and a projection optical system having a plurality of optical elements arranged along an optical axis to project an image of a pattern illuminated with light onto a substrate. One of a plurality of optical plates having different optical characteristics is interposed between the pattern and the substrate depending on the pattern. An adjusting system adjusts a characteristic of the projected image based on a calculation using one of a plurality of parameters corresponding to the optical plates, the one parameter being selected in accordance with the one optical plate to compensate for a change in an optical property of the projection optical system caused by the change of the optical plate. The projection exposure apparatus may include an optical filter for making light passing through a partial area, which is centered at an optical axis of the projection optical system and light passing through an area other than the partial area different from each other in phase or transmittance, or for reducing coherence between light passing through the said two areas. The projection exposure apparatus also may include a transparent plate having an optical thickness which is approximately equal to that of the optical filter, in which one of the optical filter and the transparent plate is disposed on a pupil plate of the projection optical system or a plane in the neighborhood of the pupil plane during exposure.

36 Claims, 13 Drawing Sheets

U.S. PATENT DOCUMENTS

| | | |
|---|---|---|
| 4,936,665 | 6/1990 | Whitney . |
| 5,117,255 | 5/1992 | Shiraishi et al. . |
| 5,302,999 | 4/1994 | Oshida et al. . |
| 5,329,336 * | 7/1994 | Hirano et al. ........................... 355/53 |
| 5,348,837 | 9/1994 | Fukuda et al. . |
| 5,357,312 | 10/1994 | Tounai . |
| 5,392,094 * | 2/1995 | Kudo ..................................... 355/55 |
| 5,426,521 | 6/1995 | Chen et al. . |
| 5,436,692 | 7/1995 | Noguchi . |
| 5,448,336 * | 9/1995 | Shiraishi ................................ 355/71 |
| 5,576,801 * | 11/1996 | Ushida et al. ......................... 355/53 |
| 5,627,626 * | 5/1997 | Inoue et al. ............................ 355/67 |
| 5,739,898 * | 4/1998 | Ozawa et al. ......................... 355/53 |
| 5,912,727 * | 6/1999 | Kawai .................................... 355/67 |

\* cited by examiner

*Fig. 16*
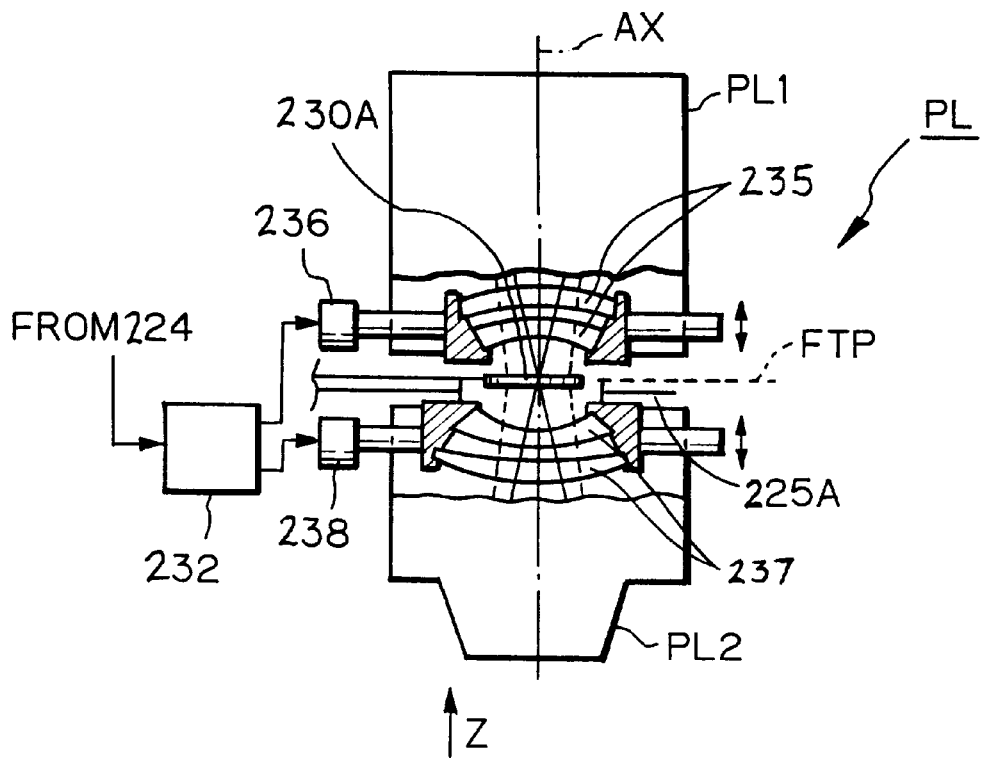
*Fig. 17(a)*   *Fig. 17(b)*
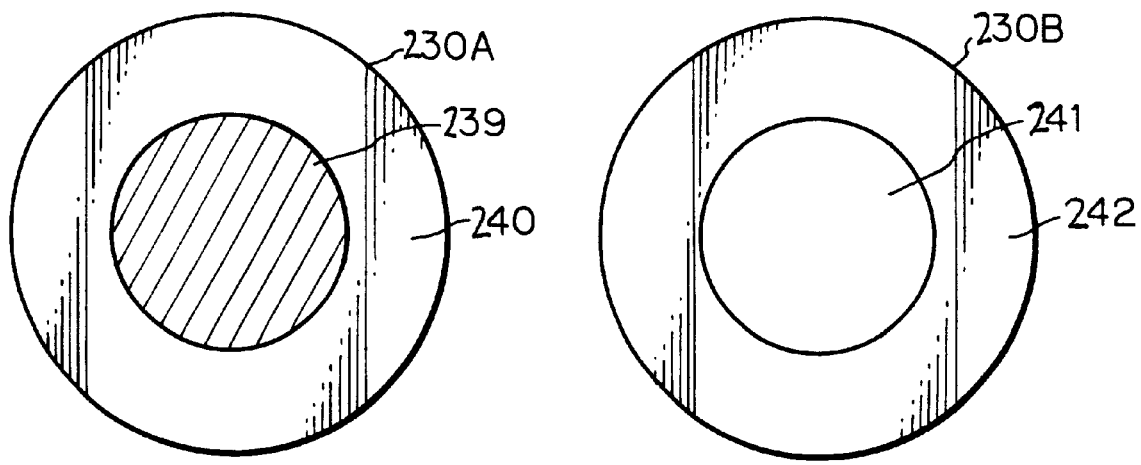

PROJECTION APPARATUS AND METHOD

This application is a Continuation-In-Part of U.S. application Ser. No. 274,752 filed Jul. 14, 1994, which issued as U.S. Pat. No. 5,448,336 on Sep. 5, 1995; U.S. application Ser. No. 08/385,876, filed Feb. 9, 1995 now U.S. Pat. No. 5,610,684; and of U.S. application Ser. No. 08/411,306, filed Mar. 27, 1995, now U.S. Pat. No. 5,677,757.

BACKGROUND OF THE INVENTION

1. Field of the Invention

The present invention relates to a projection exposure apparatus used for forming fine patterns in, for example, semiconductor integrated circuits, liquid crystal displays, etc. More particularly, the present invention relates to a projection exposure apparatus having a mechanism for maintaining the image-forming performance of its projection optical system in a favorable condition.

2. Description of the Related Art

A photolithography process for forming a circuit pattern in a semiconductor device or the like uses a projection exposure apparatus (e.g., stepper) in which a pattern formed on a mask (a reticle) is transferred to a photosensitive substrate (e.g., a semiconductor wafer, glass plate, etc.), which has been coated with a photoresist, through a projection optical system. The projection optical system of such a projection exposure apparatus is incorporated in the apparatus after high-level optical designing, careful selection of a vitreous material, superfine processing of the vitreous material, and precise assembly adjustment. The present semiconductor manufacturing process mainly uses a stepper in which a reticle (or a photomask, etc.) is irradiated with the i-line (wave-length: 365 nm) of a mercury-vapor lamp as illuminating light, and light passing through a circuit pattern on the reticle is passed through a projection optical system to form an image of the circuit pattern on a wafer (or a glass plate, etc.), which has been coated with a photoresist. An excimer stepper that employs an excimer laser (KrF laser of wavelength 248 nm) as an illuminating light source has also been used for evaluation or research purposes.

With the steady increase of the degree of integration of VLSI and other similar devices, various methods have been developed for projection exposure apparatuses in order to perform transfer of finer patterns, such as optimization of illuminating conditions, new schemes of exposure method, etc. For example, there has been proposed a method of improving the resolution and DOF (Depth of Focus) by previously obtaining the most suitable combination of a coherence factor of the illuminating optical system (i.e., value: the ratio of the numerical aperture (N.A.) of the illuminating optical system to the numerical aperture of the projection optical system) and the numerical aperture of the projection optical system for each specific pattern line width, and selecting the most suitable combination for each pattern line width.

Among projection exposure apparatuses which are presently put to practical use, those which are designed for the i-line include a projection optical system having a numerical aperture (NA) of about 0.6. In general, for the same wavelength of illuminating light used, as the numerical aperture of the projection optical system is increased, the resolution improves correspondingly. However, as the numerical aperture NA increases, the focal depth DOF becomes shallower in proportion to $\lambda/NA^2$, where $\lambda$ is the wavelength of illuminating light.

Incidentally, the resolution can be improved by increasing the image-side numerical aperture NAw (cf. the object-side numerical aperture NAr) of the projection optical system. That is, the resolution can be improved by increasing the pupil diameter of the projection optical system and also increasing the effective aperture of an optical element, e.g., lens, which constitutes the projection optical system. However, the focal depth DOF decreases in inverse proportion to the square of the numeral aperature NAw. Accordingly, even if a projection optical system of high numerical aperature can be produced, the required focal depth cannot be obtained; this is a considerable problem practical use.

Assuming that the wavelength of illuminating light is 365 nm of the i-line and the numerical aperature NAw is 0.6, the focal depth DOF decreases to about 1 μm (±0.5 μm) in total range. Accordingly, a resolution failure occurs in a portion whenever the surface unevenness or the curvature is greater than DOF within one shot area (which is about 20 by 20 mm to 30 by 30 mm square) on the wafer.

In order to cope with these problems, the following various methods have been devised:

First, super-high resolution techniques, e.g., an annular zone illuminating method, modified light source method, phase shift method, etc., have been proposed. Among them, the annular zone illuminating method is a technique whereby the light intensity distribution of an illuminating light beam in a pupil plane of an illuminating optical system or a plane neighboring it is regulated to an annular zone shape, and a reticle pattern is illuminated with such an illuminating light beam, as disclosed in Japanese Patent Application Public Disclosure (KOKAI) No. Sho 61-91662. The modified light source method (also known as SHRINC method or inclined illuminating method) is a technique whereby the light intensity distribution of an illuminating light beam in a pupil plane of an luminating optical system or a plane neighboring it is made maximum at least at one position that is a predetermined amount off from the optical axis of the illuminating optical system, and thus the illuminating light beam is applied to a reticle pattern at a predetermined angle of inclination, as disclosed in Japanese Patent Application Public Disclosure (KOKAI) Nos. Hei 04-101148, Hei 04-180612, Hei 04-225358, Hei 04-180613 and Hei 04-225514.

In regard to these problems, super-high resolution techniques have been proposed, for example, a phase shift method such as that disclosed in Japanese Patent Application Post-Exam Publication No. Sho 62-50811, and a SHRINC (Super High Resolution by Illumination Control) method disclosed, for example, in WO92/03842, Japanese Patent Application Disclosure (KOKAI) No. Hei 04-180612 and Japanese Patent Application Disclosure (KOKAI) No. Hei 04-1801613 (corresponding to U.S. Ser. No. 791,138 filed on Nov. 13, 1991).

The phase shift method is carried out by using a phase shift reticle having a phase shifter (e.g., a dielectric thin film) whereby the phase of light passing through a specific one of light-transmitting portions of a circuit pattern formed on the reticle is shifted by $\pi$[grad] with respect to the phase of light passing through another light-transmitting portion, as disclosed. The use of such a phase shift reticle enables the resolution to be improved in comparison to the use of an ordinary reticle (i.e., a conventional reticle composed only of a light-transmitting portion and a light-blocking portion) for a predetermined pattern. It should be noted that typical phase shift reticles include a spatial frequency modification type (Japanese Patent Application Publication No. Sho 62-50811), a half-tone type (Japanese Patent Application Public Disclosure (KOKAI) No. Hei 04-162039), a shifter shielding type, and an edge enhancement type.

However, none of the above-described methods are effective for all reticle patterns, that is, all line widths and configurations. Therefore, it is necessary to select an illuminating method and conditions which are most suitable for each reticle or reticle pattern. Accordingly, the projection exposure apparatus needs to have a structure which enables illuminating conditions (v value and other conditions) in the illuminating optical system to be varied. For example, when the phase shift method is used, it is necessary to optimize the a value of the illuminating optical system.

Further, with the above-described methods, advantages such as an improvement in the resolution and an increase in the focal depth can be effectively obtained when a circuit pattern to be transferred is a periodic pattern having a relatively high density. However, substantially no effect can be obtained for discrete patterns (isolated patterns) such as those called "contact hole patterns".

To enlarge the apparent focal depth for isolated patterns, e.g., contact hole patterns, an exposure method has been proposed, for example, in U.S. Pat. No. 4,869,999, in which exposure for one snow area on a wafer is carried out in a plurality of successive exposure operations, and the wafer is moved along the optical axis of the projection optical system by a predetermined amount during the interval between each pair of successive exposure operations. This exposure method is called FLEX (Focus Latitude enhancement Exposure) method and provides satisfactory factory focal depth enlarging effect for isolated patterns, e.g., contact hole patterns. However, since the FLEX method indispensably requires multiple exposure of contact hole pattern images which are slightly defocused, a resist image obtained after development inevitably lowers in sharpness (the rise of the edge of the resist layer).

There has also been proposed a technique whereby the focal depth is increased during projection of contact hole patterns by a method different from the FLEX method wherein the wafer is moved along the optical axis during the exposure operation. In the Super-FLEX method published in Extended Abstracts (Spring Meeting, 1991) 29a-ZC-8, 9, Japan Society of Applied Physics, a phase filter having a concentric amplitude transmittance distribution centered at the optical axis is provided on the pupil plane (i.e., a Fourier transform plane with respect to the reticle) of the projection optical system so as to increase the effective resolution and focal depth of the projection optical system by the action of the filter.

The method wherein the transmittance distribution or phase difference is changed by filtering at the pupil plane of the projection optical system to thereby improve the focal depth as in the case of the Super FLEX method is generally known as "multifocus filter method". The multifocus filter method is detailed in the paper entitled "Study of Imaging Performance of Optical System and Method of Improving the Same", pp.41–55, in Machine Testing Institute Report No. 40, issued on Jan. 23, 1961. The method of improving the image quality by spatial filtering at the pupil plane is generally called a "pupil filter method". The assignee has proposed, as a new type of filter usable for such pupil filter method, a filter of the type that blocks light only in a circular area in the vicinity of the optical axis (this filter will hereinafter be referred to as "light-blocking pupil filter") in Japanese Patent Application Public Disclosure (KOKAI) No. Hei 04-179958. The assignee has further proposed a pupil filter method named "SFINCS method" that uses a pupil filter designed to reduce the spatial coherence of a bundle of image-forming rays from a contact hole pattern which passes through the pupil plane in U.S. Pat. application Ser. No. 128,685 (Sep. 30, 1993).

Separately from the above-described pupil filters for contact hole patterns, pupil filters which are effective for relatively dense periodic patterns, e.g., line and space (L&S) patterns, have also been reported, for example, in "Projection Exposure Method Using Oblique Incidence Illumination: Principle" (Matsuo et al.: 12a-ZF-7) in Extended Abstracts (Autumn Meeting, 1991), Japan Society of Applied Physics, and in "Optimization of Annular Zone Illumination and Pupil Filter" (Yamanaka et al.: 30p-NA-5) in Extended Abstracts (Spring Meeting, 1992), Japan Society of Applied Physics. These filters are adapted to reduce the transmittance (i.e., the transmitted light intensity) of a circular or annular area centered at the optical axis (this type of filter will hereinafter be referred to as "filter for L&S patterns"). In the L&S pattern filter method, the phase of light passing through the filter is not changed, unlike in the Super FLEX method.

Incidentally, the exposure apparatus is required to provide not only high resolution but also high alignment accuracy in formation of fine patterns of semiconductor integrated circuits, etc. That is, patterns of successive layers must be transferred such that the pattern of the subsequent layer is accurately superimposed on the pattern of the preceding layer. Accordingly, the exposure apparatus is required not only to perform accurate detection of alignment marks on the wafer and accurate alignment between the reticle and the wafer but also to use a projection optical system having minimal distortion. It is assumed that the distortion includes not only ordinary barrel form distortion and pincushion distortion but also random variation of the image position caused mainly by possible manufacturing errors of lens elements.

Among various exposure methods using pupil filters, the Super FLEX method, the light-blocking pupil filter exposure method and the SFINCS method enable the resolution and focal depth to be effectively increased with respect to isolated contact hole patterns among fine patterns which are to be transferred by exposure, as described above. However, for relatively dense (periodic) patterns, e.g., L&S patterns, these methods cause the resolution to lower undesirably. Therefore, when L&S patterns or other relatively dense patterns are to be exposed, it is necessary to unload the pupil filter from the projection optical system or to exchange it for a filter for L&S patterns.

As has been described above, the projection optical system is completed through a combination of high-level designing and production, together with strict adjustment, to obtain a favorable projected image. Accordingly, if the pupil filter, which changes the optical characteristics of the bundle of image-forming rays, is merely loaded, unloaded or exchanged, the image-forming characteristics of the projection optical system are undesirably changed and cannot accurately be maintained at the desired level.

In the case of an exposure apparatus designed on the premise that it will be used only for specific patterns, e.g., contact hole patterns, the projection optical system may be adjusted with a specific pupil filter incorporated thereinto when the system is set up, as a matter of course. However, the above-described problems inevitably arise in such a case where a single exposure apparatus is used for pattern transfer by exposure at various steps in order to increase the production efficiency as in the case of the present production lines for semiconductor devices or the like.

Further, there may be cases where exposure is carried out by combining together information as to whether or not a pupil filter is present and about the type of pupil filter used, and the change of illuminating conditions (i.e., change of the σ value or use of annular zone illumination, etc.). In such cases, the condition of variation of the image-forming characteristics changes under each set of conditions. The condition of variation of the image-forming characteristics also changes when the pupil filter method and a conventional high-resolution technique are employed in combination. When such a change of the image-forming characteristics is corrected through a correcting mechanism using parameters corrected as described above, no problem will arise from the long-term standpoint. However, there is a problem that the image-forming characteristics have past hysteresis on account of the phenomenon of heat accumulation in the projection optical system. Accordingly, when the illuminating conditions or the pupil filters are changed from one to another according to the type of reticle or reticle pattern, even if the amount of change of the image-forming characteristics is calculated and the characteristic change is corrected immediately on the basis of the parameters corrected under the new conditions, the image-forming characteristics cannot accurately be corrected as long as the Hysteresis according to the previous conditions remains in the projection optical system. This problem may occur in the following two forms:

Firstly, owing to the distribution of heat generated under the illuminating conditions before the change of the operating conditions and by the pupil filter used under these conditions, image-forming characteristics obtained under the new illuminating conditions and pupil filter (used after the condition change) do not coincide with the actual image-forming characteristics even if they are obtained by taking into consideration an offset component attendant on the change of the conditions. That is, since the offset component is determined under conditions where the projection optical system is not affected by the absorption of illuminating light, if the influence of the absorption of illuminating light before the change of the conditions remains, it is necessary to additionally give an offset corresponding to the influence of the absorption of illuminating light. In other words, since the amount of change of the image-forming characteristics becomes discontinuous before and after the change of illuminating conditions and pupil filters, the image-forming characteristics cannot be accurately corrected continuously when the illuminating conditions, together with the pupil filters, are changed from one to another.

Secondly, even if the first problem is solved by some method, a second problem arises from the exposure carried out under the new illuminating conditions and pupil filter. That is, immediately after the change of illuminating conditions and pupil filters, the heat distribution condition under the previous conditions and that under the new conditions overlap each other, forming a state of being neither of the two heat distribution conditions, at a lens element in the vicinity of a pupil plane of the projection optical system. Accordingly, even if an amount of change of the image-forming characteristics is calculated on the basis of the parameters under either of the illuminating conditions, the result of the calculation is not coincident with the actual amount of image-forming characteristic change. The image-forming characteristics (i.e., the heat distribution condition in the projection optical system) in such a transient state cannot be expressed simply by a sum of the characteristics before and after the change of illuminating conditions and pupil filters, and it is extremely difficult to calculate and correct a change of the image-forming characteristics in the transient state.

SUMMARY OF THE INVENTION

An object of the present invention is to provide a projection exposure apparatus capable of constantly maintaining favorable image-forming characteristics even when a pupil filter suitable for projection exposure of isolated patterns, e.g. contact holes, or a pupil filter suitable for projection exposure of relatively dense patterns, e.g., a filter for L&S patterns, is loaded, unloaded, or exchanged.

To attain the above-described object, the present invention provides a projection exposure apparatus having an illuminating optical system for irradiating a mask having a pattern with illuminating light for exposure; and a projection optical system which is composed of a plurality of optical elements and arranged to receive light emanating from the pattern of the mask, and to project an image of the pattern on a photosensitive substrate with predetermined image-forming characteristics. The projection exposure apparatus further includes an optical corrector plate inserting device whereby an optical corrector plate that changes a specific factor in the image-forming characteristics is removably inserted into a space defined by a Fourier transform plane of the projection optical system and a neighboring plane. In addition, an optical element moving device causes at least one of the optical elements to move relative to the entire projection optical system in accordance with the insertion of the optical corrector plate.

In one embodiment of the present invention, the optical corrector plate inserting device is an exchanging device that exchangeably inserts into the above-described space one of a plurality of optical filters which are different in optical action from one other.

One of the optical filters is a Super FLEX pupil filter that changes at least either the transmittance or phase (amplitude transmittance) of transmitted light at a part of the Fourier transform plane, or a filter for L&S patterns.

One of the optical filters is a SFINCS pupil filter that reduces coherence between light passing through a specific region of the Fourier transform plane and light passing through the other region of the Fourier transform plane.

One of the optical filters is a pupil filter that causes no change of the transmittance, phase, or coherence of light passing through the Fourier transform plane. That is, a pupil filter which provides a state equivalent to an ordinary state where no pupil filter is present (however, a simple plane-parallel vitreous material may be inserted).

The projection exposure apparatus of the present invention is provided with an optical element moving device that causes at least one of the constituent elements of the projection optical system to move relative to the entire projection optical system. Accordingly, a variation of the image-forming characteristics which is caused by loading, unloading, or exchanging of a pupil filter can be corrected by the action of the optical element moving device. Thus, favorable image-forming characteristics can be obtained at all times.

Another object of the present invention is to provide a projection exposure apparatus capable of obtaining favorable image-forming characteristics at all times even in a case where a plurality of pupil filters, which are different in optical performance from each other, such as a pupil filter suitable for projection exposure of isolated patterns, e.g., contact hole patterns, and a pupil filter suitable for projection exposure of relatively dense patterns, e.g., L&S patterns, are exchangeably used in the vicinity of a pupil plane of a projection optical system of the apparatus.

Still another object of the present invention is to provide a projection exposure apparatus capable of correcting optical aberrations, particularly distortion and field curvature, which occur according to the combination of a projection optical system and an optical filter when an optical filter suitable for a particular exposure method is used in a system which is provided with members for changing optical filters from one to another and members for changing image-forming characteristic correcting members respectively corresponding to the optical filters, thereby enabling a single projection exposure apparatus to be used for various types of exposure method.

Still another object of the present invention is to provide a projection exposure apparatus capable of canceling distortion by previously measuring distortion of a projection optical system in a state where an optical filter is loaded, and disposing an image-forming characteristic correcting member, which has been deformed so as to correct the distortion of the projection optical system, between a mask and the projection optical system or in the projection optical system.

A further object of the present invention is to provide a projection exposure apparatus capable of correcting field curvatures of a projection optical system, which are produced by respective optical characteristics of different types of optical filter (including light-transmitting members), by disposing an image-forming characteristic correcting member formed from a concave (or convex) lens according to the type of optical filter used.

A still further object of the present invention is to provide a projection exposure apparatus capable of minimizing variation of image-forming characteristics due to difference in optical characteristics of various types of optical filter when exchangeably used in the single projection exposure apparatus, and hence readily compatible with various types of exposure method.

A still further object of the present invention is to provide a projection exposure apparatus designed so that the effective resolution and focal depth of a projection optical system further increase when the apparatus uses an optical filter for changing at least either the amplitude distribution or phase distribution of light passing there through, that is, a pupil filter of the type that blocks light incident on the center thereof, a pupil filter for L&S patterns, or a super FLEX pupil filter.

A still further object of the present invention is to provide a projection exposure apparatus designed so that when it uses an optical filter for reducing coherence, that is, a SFINCS pupil filter, the spatial coherence of a bundle of image-forming rays from a contact hole pattern is reduced, and thus the resolution and the depth of focus increase.

A still further object of the present invention is to provide a projection exposure apparatus compatible with an exposure method requiring no optical filter when an optical filter changing member has a light-transmitting member which does not change optical characteristics, that is, a simple plane-parallel plate.

A still further object of the present invention is to provide a projection exposure apparatus designed so that, even when a pupil filter is loaded into or unloaded from a projection optical system or exchanged in a case where the resolution and the depth of focus are controlled by employing a pupil filter method, image-forming characteristics of the projection optical system are maintained in conditions which are close to the desired conditions by taking into consideration the accumulation of heat in the projection optical system, thereby enabling pattern exposure to be satisfactorily effected with respect to a photosensitive substrate.

A still further object of the present invention is to provide a projection exposure apparatus designed so that image-forming characteristics of a projection optical system are constantly maintained in conditions which are close to the desired conditions by correcting a change of the image-forming characteristics through an image-forming condition adjusting device, thereby enabling pattern exposure to be satisfactorily effected with respect to a photosensitive substrate.

A still further object of the present invention is to provide a projection exposure apparatus capable of accurately correcting image-forming characteristics of a projection optical system in a quantitative manner by changing parameters with a parameter changing circuit according to the type of pupil filter set in the projection optical system, obtaining an amount of change of the image-forming characteristics with an image-forming characteristic computing device using the parameters which have been changed, and correcting the image-forming characteristics through an image-forming condition adjusting device on the basis of the determined amount of change of the image-forming characteristics.

A still further object of the present invention is to provide a projection exposure apparatus having an image-forming characteristic computing device capable of accurately calculating an amount of change of image-forming characteristics by using an accumulated energy measured with an accumulated energy measuring device, thus enabling the image-forming characteristics to be maintained in conditions which are closer to the desired conditions.

A still further object of the present invention is to provide a projection exposure apparatus designed so that, in a case where distortion as one of image-forming characteristics of a projection optical system is aggravated by unloading or exchange of a pupil filter, a distortion correcting plate that cancels the aggravated distortion is inserted into, for example, a space between a mask and the projection optical system, thereby making it possible to prevent aggravation of the image-forming characteristics.

In order to attain the above-described objects, the present invention provides a projection exposure apparatus having an illuminating system for irradiating a mask, which has a pattern to be transferred, with illuminating light for exposure, and a projection optical system for projecting an image of the pattern of the mask onto a photosensitive substrate with predetermined image-forming characteristics under the illuminating light. The projection exposure apparatus is provided with an optical filter changing member for selecting one of a plurality of optical filters that change at least one of optical characteristics of light from the mask by respective amounts which are different from each other. The optical characteristics include an amplitude distribution, a phase distribution and a condition of polarization. The optical filter changing member further disposes the selected optical filter on a pupil plane in the projection optical system or on a plane in the neighborhood of the pupil plane. The projection exposure apparatus is further provided with a correcting member-changing member for selecting one of a plurality of image-forming characteristic correcting members that correct the image-forming characteristics of the projection optical system by respective amounts which are different from each other in accordance with the optical filter selected by the optical filter changing member, and for disposing the selected image-forming characteristic correcting member between the mask and the substrate.

In this case, one of the plurality of optical filters may be an optical filter that changes at least either the amplitude distribution or phase distribution of light from the mask according to the position on a plane in the projection optical system where it is disposed.

One of the plurality of optical filters may be an optical filter that reduces coherence between light passing through a predetermined area of a plane in the projection optical system where it is disposed and light passing through the other area of the plane.

The optical filter changing member preferably has a light-transmitting member that does not change the optical characteristics of light from the mask.

The plurality of image-forming characteristic correcting members may be adapted to correct distortion of the image projected by the projection optical system by respective amounts which are different from each other.

Alternatively, the image-forming characteristic correcting members may be adapted to correct the curvature of field of the image projected by the projection optical system by respective amounts which are different from each other.

In addition, the present invention provides a projection exposure apparatus having, as shown for example in FIGS. 8 and 9, an illuminating system for illuminating a mask having a pattern to be transferred, and a projection optical system for projecting an image of the mask pattern onto a photo-sensitive substrate with predetermined image-forming characteristics under the illuminating light applied from the illuminating system. The projection exposure apparatus is provided with an optical characteristic varying member for changing at least one of optical characteristics on a pupil plane in the projection optical system or on a plane in the neighborhood of the pupil plane. The optical characteristics include polarizing characteristic distribution, transmittance distribution and phase distribution. The projection exposure apparatus is further provided with an image-forming condition adjusting device for adjusting the condition of image formation of the image projected onto the photosensitive substrate by the projection optical system, and an image-forming characteristic correcting member for correcting through the image-forming condition adjusting device a change of a predetermined image-forming characteristic of the image projected onto the photosensitive substrate by the projection optical system, which is caused when the optical characteristic varying member is used to change the corresponding optical characteristic.

In this case, the image-forming characteristic correcting member may have a parameter changing member, an image-forming characteristic computing device, and a controller. The parameter changing member changes a parameter used to calculate an amount of change of the predetermined image-forming characteristic in accordance with the optical characteristic changed by the optical characteristic varying member. The image-forming characteristic computing device obtains an amount of change of the predetermined image-forming characteristic by using the parameter changed by the parameter changing member. The controller corrects the change of the predetermined image-forming characteristic through the image-forming condition adjusting device on the basis of the amount of change of the image-forming characteristic obtained by the image-forming characteristic computing device.

In this case, it is preferable to provide an accumulated energy measuring device for obtaining an amount of energy accumulated in the projection optical system by the illuminating light applied from the illuminating system, so that the image-forming characteristic computing device calculates a change of the predetermined image-forming characteristic on the basis of the accumulated energy obtained by the accumulated energy measuring device and the parameter set by the parameter changing member.

It is also possible to provide an accumulated energy measuring device for obtaining an amount of energy accumulated in the projection optical system by the illuminating light applied from the illuminating system, and an exposure judging device which suspends exposure of the mask pattern from the time the optical characteristic varying member changes the corresponding optical characteristic until the accumulated energy obtained by the accumulated energy measuring device reduces to a level lower than a predetermined allowable energy level by thermal diffusion.

In each of the above-described arrangements, a distortion correcting plate may be inserted into the space between the mask and the photosensitive substrate to correct distortion of the image projected onto the photosensitive substrate by the projection optical system, which is caused when the optical characteristic varying member is used to change the corresponding optical characteristic.

BRIEF DESCRIPTION OF THE DRAWINGS

FIG. 16 is a partly-cutaway view showing the arrangement of a mechanism for correcting spherical aberration in a projection optical system used in the embodiment shown in FIG. 14.

FIGS. 17(a) and 17(b) are enlarged plan views showing examples of the arrangement of a pupil filter used in the embodiment shown in FIG. 14.

DESCRIPTION OF THE PREFERRED EMBODIMENTS

The present invention will be described below in detail with reference to the accompanying drawings.

Figure 1:
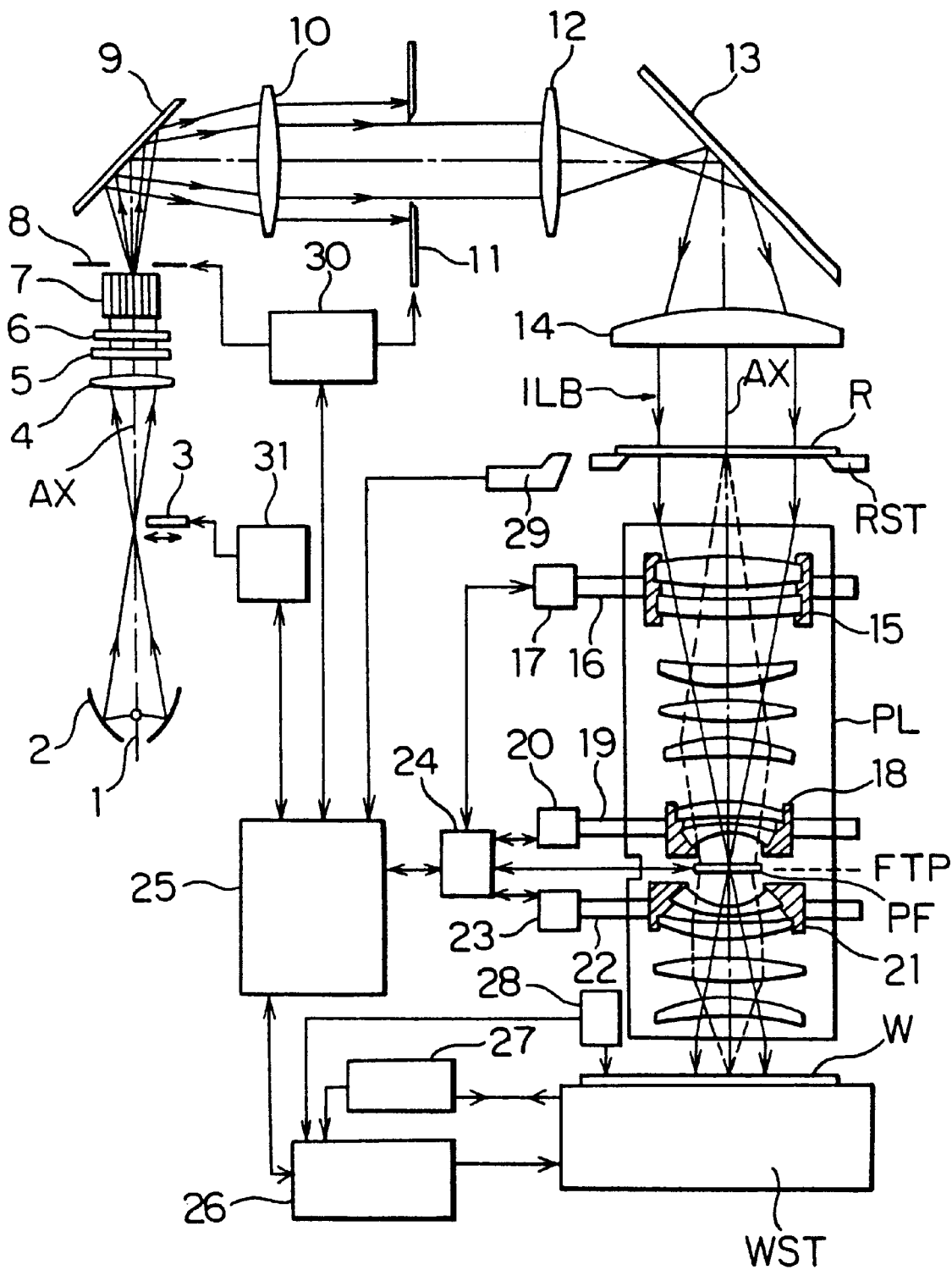
FIG. 1 is a schematic view showing the arrangement of one embodiment of the projection exposure apparatus according to the present invention.

FIG. 1 shows one embodiment of the projection exposure apparatus according to the present invention. Referring to the figure, a reticle R has a pattern to be transferred drawn on a pattern surface defined on the lower side (projection optical system side) thereof. The pattern is projected on a substrate to be exposed, e.g., a wafer W, through a projection optical system PL and transferred thereto by exposure. An illuminating light beam ILB for illuminating the reticle R is emitted from a light source, e.g., a mercury-vapor lamp 1. From the emitted light, only the i-line (wavelength: 0.365 $\mu$m), for example, is selected through an elliptical mirror 2, an input lens 4, a short-wavelength cut filter 5 and an interference filter 6. The illuminating light (i-line) emanating from the interference filter 6 then enters a fisheye lens 7. It should be noted that a light source used in the exposure apparatus of the present invention is not necessarily limited to an emission line lamp such as a mercury-vapor lamp. For example, a beam from a laser light source or the like may be made incident on the fisheye lens 7 after being collimated.

The exit-side surface of the fisheye lens 7 forms a Fourier transform plane in the illuminating optical system with respect to the reticle pattern, where a surface illuminant image (i.e., a plane composed of the set of a plurality of point light sources corresponding to the element lenses of the fisheye lens 7 is formed, and where a σ stop 8 that defines the shape and size of the surface illuminant image is also provided.

The illuminating light emanating from the fisheye lens 7 and passing through the σ stop 8 illuminates the reticle R via mirrors 9 and 13, lens systems 10 and 12, and a condenser lens 14. A variable illuminating field stop (reticle blind) 11 is placed in conjugate relation to the pattern surface of the reticle R by the action of the lens system 12 and the condenser lens 14, thereby enabling the reticle illuminating range to be varied. The lens system 10 is set so that the σ stop 8 (surface illuminate image) forms a Fourier transform plane with respect to the reticle blind 11 or that pattern surface of the reticle R.

The bundle of rays transmitted and diffracted by the reticle R is focused by the projection optical system PL to form a pattern image of the reticle R on the wafer W. It should be noted that the broken line extending from the reticle R to the wafer W in FIG. 1 shows the optical path of a bundle of image-forming rays emanating from one hole pattern on the reticle R. In this embodiment, the projection optical system PL is designed so that a pupil plane FTP in the projection optical system PL, i.e., an optical Fourier transform plane with respect to the reticle R, lies in a hollow space, and an optical corrector plate is provided on the pupil plane FTP or a plane neighboring to it. In this example, the optical corrector plate is one pupil filter PF selected from among a plurality of optical filters, which will be described later. Although the system shown in FIG. 1 employs Koehler illumination in which the pupil plan FTP in the projection optical system PL is conjugate to the position of the surface illuminant image defined by the σ stop 8 in terms of geometrical optics, it should be noted that the illumination method is not necessarily limited to the Koehler illumination.

The projection optical system PL is composed of a multiplicity of lens systems. Some of the lens systems are retained by respective movable retaining members 15, 18, and 21, which are joined to driving mechanisms 17, 20, and 23 through support members 16, 19, and 22, respectively, so that these lens systems are movable relative to the entire projection optical system PL. These optical element moving devices (i.e., the movable retaining members, support members, and driving mechanisms) are controlled by an optical system controller 24. The movement of each moveable lens system by the associated optical element moving device is effected mainly along the optical axis AX of the projection optical system PL. However, there are cases where it is necessary to move a movable lens system in a direction perpendicular to the optical axis AX or to rotate it about an axis other than the optical axis AX (i.e., to tilt the lens system), as described later. Therefore, it is desirable for each movable lens system to be movable (rotatable) with multiple degrees of freedom.

Loading, unloading, or exchanging of a pupil filter causes variation of various optical aberrations. Among the aberrations, variations in spherical aberration in particular can be effectively compensated by moving one or a plurality of lens elements retained by the movable retaining members 18 and 21 in the vicinity of the pupil plane FTP. Various distortions, astigmatism, and field curvature can be effectively compensated by moving one or a plurality of lens elements retained by the movable retaining member 15 in the vicinity of the reticle R. Thus, compensation (correction) for general variations in aberration can be satisfactorily made by moving each lens element only along the optical axis.

The optical system controller 24 also affects control for the exchange of a pupil filter PF. Since an optimum amount of movement (rotation) of each movable lens element may vary with the pupil filter PF used, the optical system controller 24 is set so that the amount of movement or rotation of each movable lens element is optimized synchronously with the exchange of the pupil filter PF. It should be noted that a command as to which pupil filter should be used for exposure can be appropriately input to a main control system 25 by the operator through a console (not shown) or the like. However, since a type of appropriate pupil filter PF is solely determined by the type of reticle pattern to be transferred, filters may be automatically exchanged by reading with a bar code reader 29, for example, the name, code, or the like of a reticle R to be used and determining a type of pupil filter PF to be used on the basis of the recognized name or code. Also in this case, each movable lens element is moved to and set at an optimum position according to a selected pupil filter PF under the control of the optical system controller 24 as a matter of course.

Incidentally, the wafer W is retained on a holder of a wafer stage WST which is adapted to move two dimensionally in an XY-plane perpendicular to the optical axis AX. The position of a wafer stage WST is accurately measured by a length measuring machine, e.g., a laser interferometer 27. A wafer alignment sensor 28 detects the position of an alignment mark (registration mark) formed on the wafer W or of a positional error. A stage controller 26 controls a motor for driving the wafer stage WST on the basis of the value detected by the wafer alignment sensor 28 and the value measured by the laser interferometer 27, thereby setting the wafer W to an accurate exposure position.

The main control system 25 sends commands not only to the optical system controller 24, but also to the stage controller 26, a shutter controller 31, a σ stop, and a reticle blind controller 30, etc. These commands control the opening and closing operation of a shutter 3 disposed in the vicinity of the second focal point of the elliptical mirror 2 and the aperture setting of the σ stop 8 or the reticle blind 11.

Figure 2:
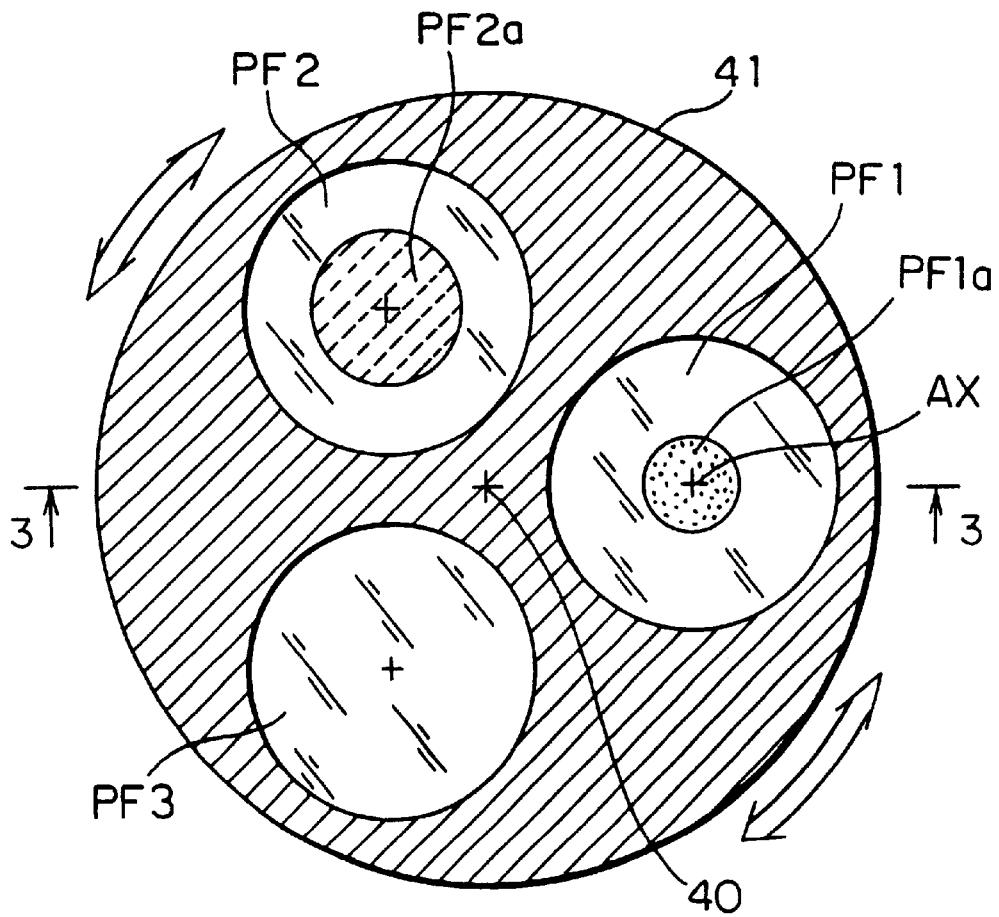
FIG. 2 is a plan view of pupil filters as shown in FIG. 1 and a pupil filter exchanging mechanism.

FIG. 2 is a plan view showing pupil filters PF and a pupil filter exchanging mechanism. Three different types of pupil filters PF1, PF2, and PF3 are retained on a rotary plate 41 at regular spacings of 120°. The rotary plate 41 is rotatable about an axis 40 of rotation. It is assumed that, in the state illustrated in the figure, a Super-Flex pupil filter PF1, which inverts the phase of light passing through a central circular region PF1$a$ with respect to the phase of light passing through an annular region surrounding the circular region PF1$a$, has been loaded on the pupil plane in the image-forming optical path of the projection optical system PL as a pupil filter which is suitable for exposure of contact hole patterns. The phase inversion may be effected either continuously or stepwisely.

Figure 3:
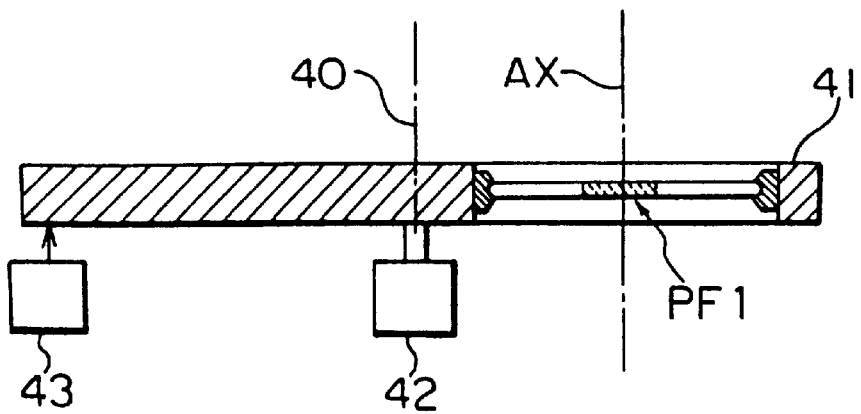
FIG. 3 is a sectional view as seen in the direction of the arrow 3—3 in FIG. 2.
Figure 4:
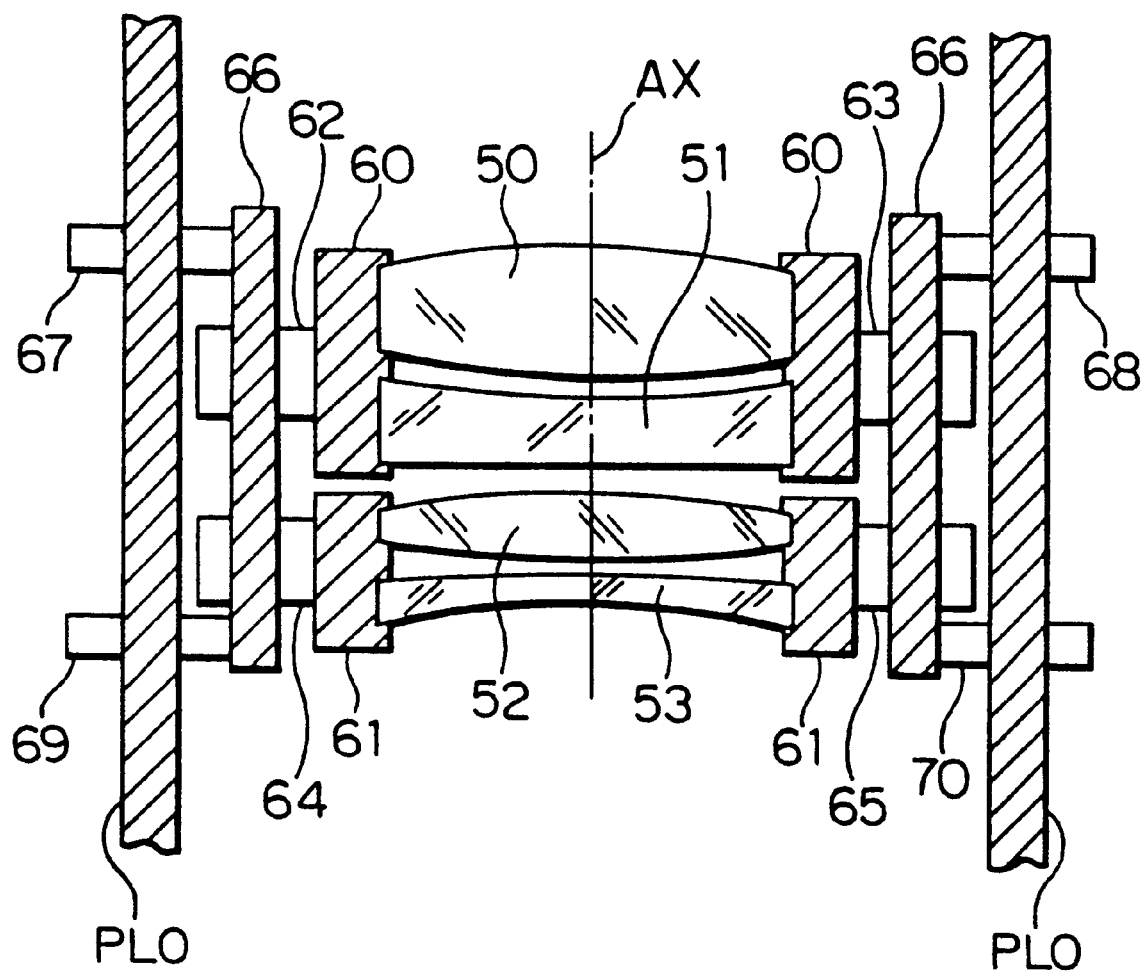
FIG. 4 shows a modification of a movable retaining mechanism as shown in FIG. 1.

FIG. 3 is a sectional view of a pupil filter PF and the pupil filter exchanging mechanism as seen in the direction of the arrow 3—3 in FIG. 2. The rotary plate 41 is caused to rotate about the axis 40 of rotation by a rotation driving unit 42, which is retained by a projection optical system lens mount PLO (FIG. 4). In addition, an encoder 43 is provided to accurately measure the rotational position of the rotary plate 41, and it is assumed that the rotary plate 41 has grating patterns (scale patterns) cut in the peripheral edge thereof for indexing.

As one example, the Super FLEX pupil filter PF1 is formed from a transparent flat plate of glass, quartz, etc., which has a transparent dielectric film formed over its central circular region PF1$a$. Of the other two pupil filters, the filter PF2 is arranged such that the transmittance of a circular region PF2$a$ defined in the center of the filter PF2 is lower than the transmittance of the surrounding region. The pupil filter PF2 is used for exposure of L&S (line and space) patterns. The pupil filter PF2 is formed from a transparent flat plate having a light-absorbing member, e.g., a metal thin film, formed over its central circular region PF2$a$. It is even more preferable that, when a pupil filter for L&S patterns is to be used, the illumination of the reticle R by the illuminating optical system 1 to 14 should be effected by the so-called annular zone illumination method. Accordingly, the σ stop 8 in FIG. 1 is preferably adapted to be compatible with annular zone illumination. More specifically, the surface illuminant image is partially obscured by the σ stop 8 so that is formed into an annular zone shape. Therefore, it is preferable to prepare a plurality of σ stops 8 having different aperture configurations and to arrange the system so that the σ stops 8 can be appropriately exchanged by an exchanging mechanism similar to that shown in FIG. 2.

The other filter PF3 is formed from a uniform transparent flat plate (i.e., plain glass) which gives neither a transmittance difference nor a phase difference over the entire surface thereof. That is, the filter PF3 provides a state equivalent to a state where no pupil filter is used. The reason why such a filter PF3 is needed is that the other two pupil filters PF1 and PF2 are transparent plates each having an optical thickness. Therefore, when neither of the pupil filters PF1 and PF2 is used, the optical characteristics must be compensated for in a manner such that an optical thickness equal to that of the pupil filters PF1 and PF2 is ensured, that is, it is necessary to perform an operation of making the optical path length uniform.

For the same reason, it is preferable that the optical thicknesses of a plurality of pupil filters used in the present invention should be approximately equal to each other. However, in this embodiment, each movable lens element in the projection optical system PL can be adjusted to an optimum position in accordance with each pupil filter by the optical element moving device so that variation of the image-forming characteristics (i.e., increase in aberration) caused by exchange of pupil filters is minimized. Therefore, the tolerance for variation in optical thicknesses of a plurality of pupil filters can be markedly increased in comparison to an arrangement having no movable lens element.

Further, the optical element moving device makes it possible to compensate for not only thickness variation among a plurality of pupil filters but also unevenness of the thickness, particularly the taper component in each pupil filter. Therefore, the tolerance for errors in production of the pupil filters themselves can be relaxed considerably. This means that the production cost of the pupil filters can be reduced to a considerable extent.

Since the compensation for unevenness of the taper component cannot satisfactorily be made by simply moving each movable lens element along the optical axis as described above, it is preferable to structure a specific movable lens element so that it is rotatable in a selected direction (about a selected axis) together with the associated movable retaining member (15, 18, 21, etc.). The rotation of a specific movable lens element herein means extremely slight tilt, and the associated rotating mechanism in only required to have a structure which enables tilting of the movable retaining member.

The movable retaining members (15, 18, 21, etc.) may be retained directly by the lens mount of the projection optical system PL through the support members (16, 19, 22, etc.), as shown in FIG. 1. Alternatively, the movable retaining members (15, 18, 21, etc.) may be retained, as shown in FIG. 4, by a projection optical system lens mount PLO through an intermediate lens mount 66. In this case, the degree of freedom for movement of the movable lens elements 50, 51, 52, and 53 further increases. FIG. 4 shows a modification of each movable retaining mechanism in the arrangement shown in FIG. 1. Two movable lens elements 50 and 51 are fixed to an inner lens mount 60, and two movable lens elements 52 and 53 are fixed to another inner lens mount 61. These two lens mounts 60 and 61 are spaced apart from each other in the direction of the optical axis AX. A pair of support members 62 and 63 retain the inner lens mount 60 with respect to the intermediate lens mount 66, and another pair of support members 64 and 65 retain the inner lens mount 61 with respect to the intermediate lens mount 66. The intermediate lens mount 66 is retained with respect to the outer lens mount PLO through support members 67, 68, 69, and 70.

With the above-described arrangement, when the four movable lens elements 50 to 53 are to be slightly moved together along the optical axis AX, the intermediate lens mount 66 is moved vertically by actuating a driving mechanism (e.g., a motor, air piston, piezoelectric element, etc.) joined to each of the support members 67 to 70. When a pair of movable lens elements 50 and 51 or 52 and 53 are to be moved singly, driving mechanisms which are joined to the pair of support members 62 and 63 or 64 and 65, which retain the respective inner lens mounts 60 and 61, should be actuated independently. The inner lens mount 60 or 61, which has a pair of movable lens elements fixed thereto, may be adapted to be tiltable. Further, at least either one of the inner lens mounts 60 and 61 may be adapted to be capable of moving slightly in a plane perpendicular to the optical axis AX.

Incidentally, pupil filters applicable to the present invention are not necessarily limited to the three types described above. It is also possible to use other types of pupil filters, for example, a light-blocking filter wherein a circular region on the vicinity of the optical axis is shielded from light, as described above, and a SFINCS pupil filter reduces the spatial coherence of a bundle of rays passing through the pupil lane, as described above. The SFINCS pupil filter enables an improvement of the focal depth when an image of a contact hole pattern is formed by reducing the coherence between light passing through a circular region in the vicinity of the optical axis and light passing though an annular region at the outer periphery of the pupil lane. The coherence may be reduced by a method wherein an optical path length not less than the coherence length (about 25 $\mu$m in the case of the i-line having a wavelength of 365 nm and a wavelength width $\Delta\lambda$ of 5 nm) is given between two bundles of rays which respectively pass through a central circular portion and an annular region surrounding it. In this case, a transparent substrate in which the central circular portion and the peripheral annular portion are different from each other in thickness or refractive index is used as an actual pupil filter plate.

It is also possible to reduce the coherence by a method wherein light passing through a region in the vicinity of the optical axis and light passing through an outer peripheral region of the pupil plane differ in polarization characteristics. An actual pupil filter plate used in this case comprises a transparent substrate and polarizing plates, a halfwave plate and quarter-wave plate disposed on the substrate so that the directions of linear polarization in the central circular portion and the peripheral annular portion intersect perpendicularly to each other.

In FIG. 5, sections (A), (B), and (C) show examples of SFINCS pupil filters. As shown in FIG. 5(A), a basic SFINCS pupil filter is formed from a transparent circular substrate having a radius $D_0$ slightly larger than the effective pupil radius $r_0$ in the projection optical system PL, and has a central circular region PFc with a radius $r_1$, ($r_1 < r_0$) and an annular region PFs$_1$ with an inner radius $r_1$ and an outer radius $r_0$. In order to prevent interference between a bundle of image-forming rays passing through the circular region PFc and a bundle of image-forming rays passing through the annular region PFs$_1$, the optical path length difference (thickness difference) between the circular region PFc and the annular region PFs$_1$ is set to be not less than the coherence length of illuminating light for exposure, or the circular region PFc and the annular region PFs$_1$ are formed from polarizing materials whereby bundles of image-forming rays respectively passing through these two regions are made different from each other in the condition of polarization. In the case of a SFINCS pupil filter as shown in FIG. 5(A), an optimum relationship between the radii $r_0$ and $r_1$ is given by $2r_1^2 = r_0^2$, that is, $0.707 r_0 = r_1$. When the optimum condition is satisfied, the largest focal depth enlarging effect is theoretically obtained. This condition is analytically deduced under conditions in which the amount of wavefront aberration of an image formed by a ray bundle passing though the circular region PFc and the amount of wavefront aberration concerning an image formed by a ray bundle passing through the annular region PFs$_1$ are made approximately equal to each other.

Figure 5A:
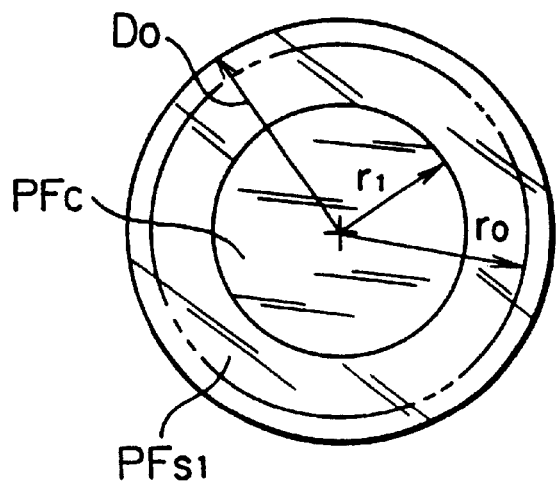
FIG. 5 shows various pupil filters wherein sections (A), (B), and (C) show examples of SFINCS pupil filters, and section (D) shows one example of a light-blocking pupil filter formed form a metal plate.
Figure 5B:
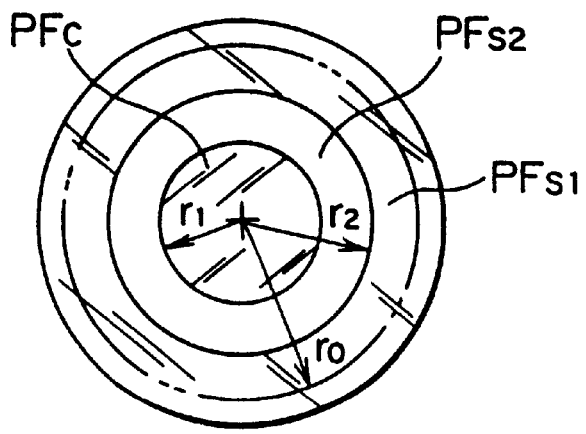

FIG. 5(B) shows a SFINCS pupil filter in which the pupil plane is divided into three regions. That is, a central circular region PFc (radius $r_1$), an inner annular region PFs$_2$ (outer radius $r_2$) adjacent to the outer periphery of the circular region PFc, and outer annular region PFs$_1$ (radius not less that $r_0$) adjacent to the outer periphery of the inner annular region PFs$_2$. In this case, an optimum condition is given by $r_1^2 = (r_2^2 - r_1^2) = (r_0^2 - r_2^2)$. The pupil filter is arranged such that there is no interference between a bundle of image-forming rays passing through the circular region PFc and a bundle of image-forming rays passing through the inner annular region PFs$_2$, which is adjacent to the circular region PFc, and that there is no interference between a bundle of image-forming rays passing through the inner annular region PFs$_2$ and a bundle of image-forming rays passing through the outer annular region PFs$_1$. The condition in this case is also uniquely obtained under conditions in which the amounts of wavefront aberration with respect to unit defocus quantity of bundles of image-forming rays passing through the three regions PFc, PFs$_1$, and PFs$_2$ are made approximately equal to each other.

Figure 5C:
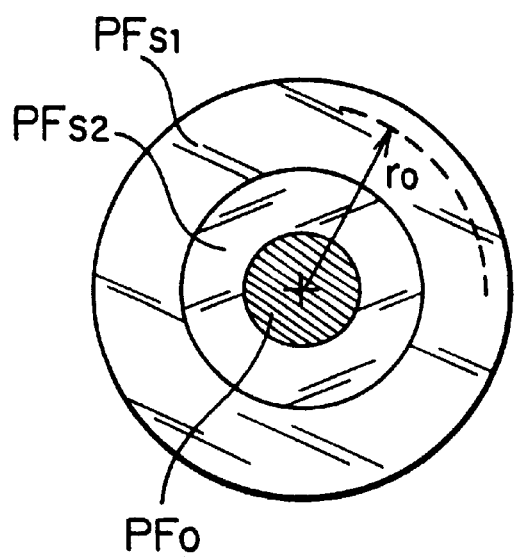

FIG. 5(C) shows a SFINCS pupil filter formed by providing a light-blocking portion PFo having a predetermined radius in the center of the circular region PFc of the pupil filter as shown in FIG. 5(A). As a result, the circular region PFc in FIG. 5(A) forms an annular region PFs$_2$.

The SFINCS pupil filters shown in sections (A), (B), and (C) of FIG. 5 are different in the principle of image formation from multifocus filters such as Super FLEX pupil filters That is, formation of an image of a projected contact hole pattern is effected by an image-forming ray bundle composed of partial ray bundles divided so as to be incoherent to each other. Accordingly, on the image plane, the partial ray bundles form intensity distributions of the hole pattern image independently from one another, which are added together in terms of light intensity (i.e., incoherent addition; in the Super FLEX method, coherent addition is made). All images that are formed by the partial ray bundles suffer from minimal wavefront aberration when they are defocused. That is, assuming that the image-forming system having a SFINCS pupil filter is defocused in order to produce the same amount of wavefront aberration as that produced when a conventional image-forming systems that uses the effective pupil diameter $r_0$ as it is defocused by $\Delta F$, in the case of the filter shown in FIG. 5(a), the image-forming system is allowed to be defocused up to $2 \times \Delta F$. In the case of the filter shown in FIG. 5(B), the image-forming system is allowed to be defocused up to $3 \times \Delta F$.

Figure 5D:
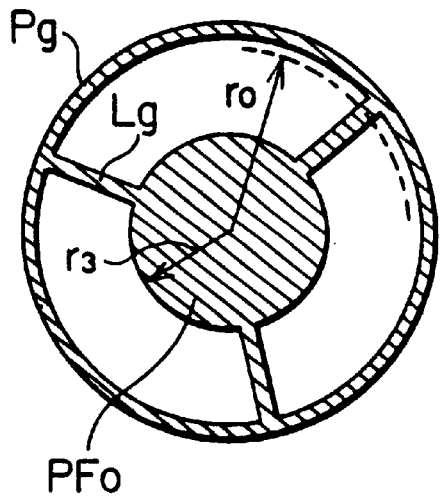

Although in the foregoing embodiment all the pupil filters use a transparent substrate having an optical thickness as a base, the present invention is not necessarily limited to the described arrangement. For example, the light-blocking pupil filter may be a light-blocking plate formed by hollowing out a light-blocking metal plate such that only a portion serving as a light-transmitting portion is removed, with a central circular region left as it is (the relationship between the radius $r_3$ of the central circular region and the effective pupil radius $r_0$ is preferably as follows: about $0.3r_0 \leq r_3 \leq$ about $0.7r_0$). Such a light-blocking plate is detailed in Japanese Patent Application Disclosure (KOKAI) No. Hei 04-179958 (corresponding to U.S. Ser. No. 76,429 filed on Jun. 14, 1993), which has been mentioned above. In a case where such a light-blocking pupil filter is used for contact hole patterns, in order to realize "a state where no pupil filter is used" as in the conventional practice, a filter having no optical thickness is used, provided that the idea of matching optical path lengths with each other is followed in the same way as in the foregoing embodiment. That is, when there is a need for a pupil filter for providing a conventional state where no pupil filter is used, it is not necessary to use a uniform transparent flat plate such as that described above (see PF3 in FIG. 2), but it is only necessary to remove a light-blocking pupil filter as shown in FIG. 5(D) from the pupil plane FTP. Although in the light-blocking plate formed from a metal plate, shown in FIG. 5(D), the central circular light-blocking portion PFo is joined to the peripheral annular light-blocking portion Pg by three spoke-shaped rims Lg at regular spacings of 120°, the two light-blocking portions PFo and Pg may be joining by two rims Lg which are spaced 180° apart from one another. Further, the metal plate filter shown in FIG. 5(D) does not necessarily need to be formed from a completely light-blocking material, but may be formed by using a material which gives an appropriate transmittance to the central circular region, or a dense mesh-shaped material.

Incidentally, in a projection optical system from which various aberrations have been completely eliminated, no secondary image-forming characteristic variation occurs in theory when the projection optical system is loaded with a light-blocking pupil filter formed from a metal plate having no optical thickness as described above. In an actual projection optical system, however, slight aberration is left uncorrected because of the heterogeneity of the vitreous material itself, a possible small manufacturing error of each lens element, etc. It is a matter of course that such residual aberration is held down to such an extent that there is practically no problem in terms of each factor in image-forming characteristics between the reticle R and the wafer W by finely adjusting the relative position between the optical elements and so forth at the final adjusting stage. However, it is difficult to adjust the positional relationships between the pattern surface of the reticle R and the pupil plane FTP and between the pupil plane FTP and the surface of the wafer W to a strict optical fourier transform relation while maintaining the required various image-forming characteristics. As long as various image-forming characteristics are considered to be of high priority, there are cases where the optical Fourier transform relation cannot strictly be satisfied.

In a projection optical system where the Fourier transform relation is not strictly maintained as described above, secondary image-forming characteristics (particularly aberrations) are likely to vary when a light-blocking pupil filter formed from a metal plate is loaded. However, the optical element moving device in the present invention can also compensate for such aberration variation, as a matter of course.

Although the projection optical system that is used in the foregoing embodiment is an image-forming system having no or minimal aberration, there are cases where an even more favorable transfer image can be obtained by positively producing specific aberrations, particularly spherical aberrations, for the transfer of a certain type of patterns. Therefore, in a case where pupil filter is exchanged according to a pattern (reticle) to be transferred and aberration variation is compensated by the action of the optical element moving device according to the present invention, the optical element moving device may be set so that controllable spherical aberration is produced for a certain type of pattern.

Incidentally, many of recent projection exposure apparatuses are equipped with a mechanism for compensating for a variation of image-forming characteristics, which may be caused by external factors such as atmospheric pressure variation and accumulation of heat in various portions of the apparatus resulting from absorption of a part of exposure light, by controlling the atmospheric pressure in the space between specific optical elements in the projection optical system. Such a mechanism may be positively utilized so as to substitute for a part of the optical element moving device of the present invention.

There has also been proposed an arrangement in which a part of optical elements in the projection optical system is adapted to be movable as a device for compensating for a variation of image-forming characteristics caused by atmospheric pressure variation or heat accumulation. Such an existing arrangement may also be used to realize the function of the optical element moving device according to the present invention. Conversely, the optical element moving device of the present invention can also be used as a device for compensating for a variation of image-forming characteristics caused by external factors.

Figure 6A:
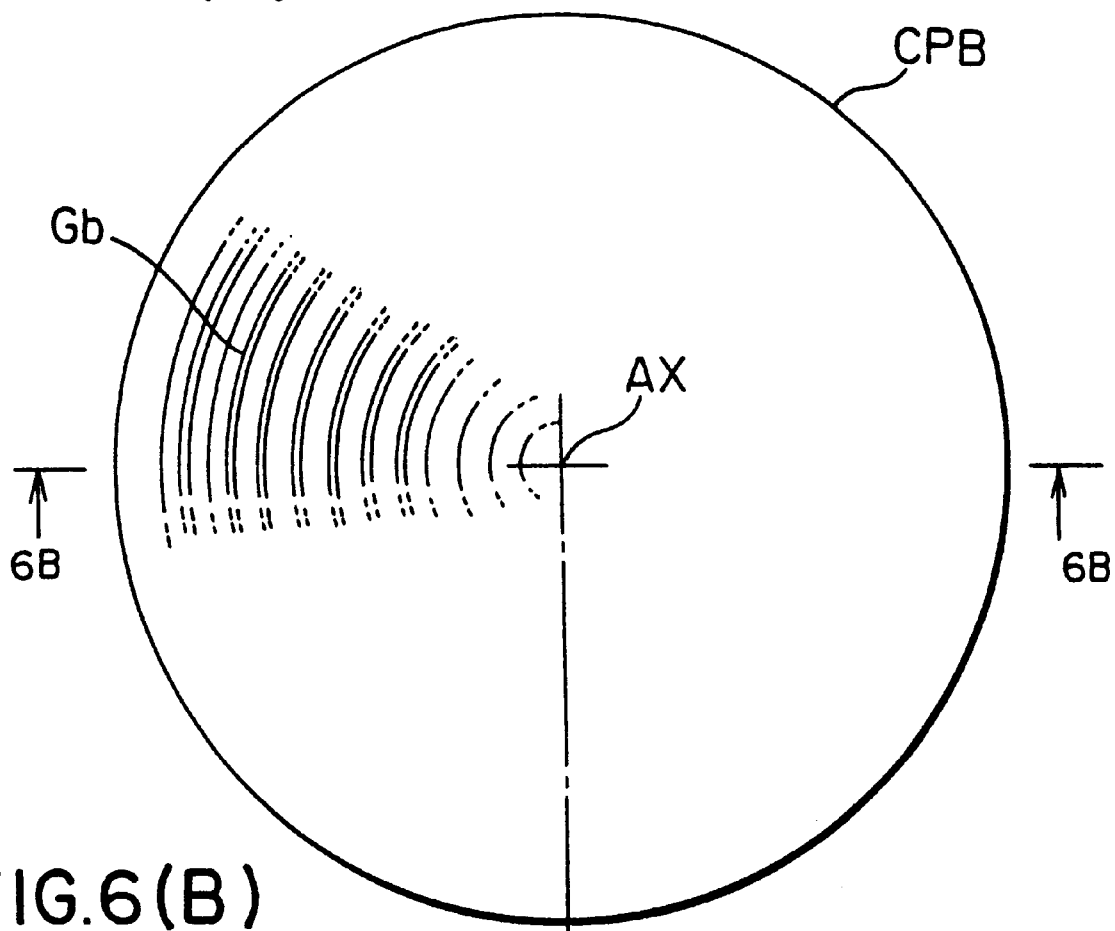
FIG. 6 shows one example of a Fresnel lens-shaped optical corrector plate which can be disposed on a pupil plane of a projection optical system in the present invention, wherein section (A) is a plan view and section (B) is a sectional view.
Figure 6B:
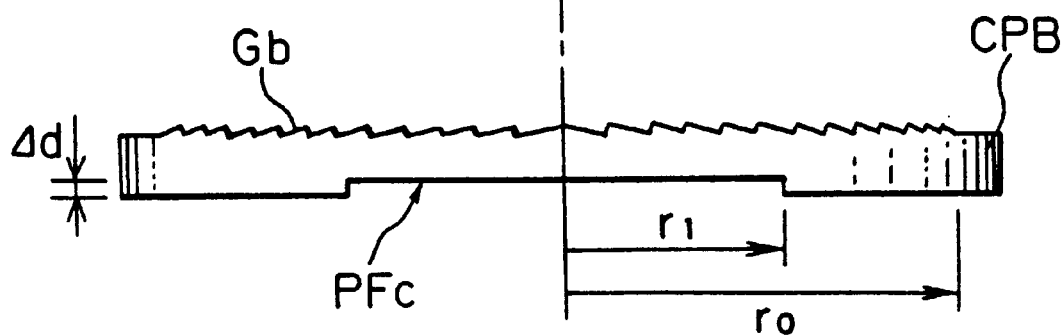

FIG. 6(A) is a plan view showing one example of a Fresnel lens-shaped optical corrector plate such as that disclosed in U.S. Pat. No. 4,936,665. FIG. 6(B) is a sectional view as seen in the direction of the arrow B–B' in FIG. 6(A). The Fresnel lens-shaped optical corrector plate can be disposed on the pupil plane FTP in the projection optical system PL to correct aberrations, particularly spherical aberrations, wavefront aberrations, or chromatic aberrations, among image-forming characteristics. As shown in section (A) and (B) of FIG. 6, an optical corrector plate CPB has plurality of concentric blazed grating patterns Gb cut in one surface thereof at predetermined radial spacings. The other surface of the optical corrector plate CPB is formed with a central circular region PFc with a step $\Delta d$ (not less than the coherence length) which functions as a SFINCS pupil filter by etching or other similar process. The optical corrector plate CPB according to the embodiment shown in FIG. 6 acts as a SFINCS pupil filter as a SFINCS pupil filter as a whole, and also has a function of self-correcting aberration, which will occur when the filter is inserted into the pupil plane FTP, by the blazed grating patterns (having Fresnel action) formed on the surface of the optical corrector plate CPB. Thus, the optical corrector plate CPB functions as a SFINCS pupil filter and also as a device for self-correcting aberration secondarily produced on account of the SFINCS pupil filter function. Accordingly, in a case where a pupil filter having a structure such as that shown in FIG. 6 is prepared, the desired results can be obtained simply by inserting and removing the pupil filter into and from the pupil plane FTP in the projection optical system PL. It should be noted that the pitch and height difference of the blazed grating patterns formed on the optical corrector plate CPB are determined so as to minimize aberration produced owing to the presence of an optical thickness of the optical corrector plate CPB. Further, the structure shown in FIG. 6 is applicable not only to SFINCS pupil filters but also to general pupil filters using a transparent substrate having an optical thickness as a base. Further, since the optical corrector plate CPB has Fresnel lens effect (i.e., it has a proper optical axis), it is necessary to set the position thereof (particularly the inclination) in the projection optical system PL with relatively high accuracy; under certain circumstances, a precision mechanism for fine adjustment in the XY-plane may be needed. In the embodiment shown in FIG. 6, the blazed grating surface of the optical corrector plate CPB is a movable optical element for image aberration correction in the present invention. Accordingly, the movable mechanism (the rotating plate 41 in FIG. 2) for loading, unloading, and exchanging a pupil filter (i.e., the optical corrector plate CPB in this case) is used to function also as a mechanism for moving an optical element constituting the projection optical system. Further, the optical corrector plate is not necessarily limited to the Fresnel lens but may be a binary optics lens, as detailed in the above-mentioned U.S. Pat. No. 4,936,665.

Although in the foregoing embodiments the present invention has been described on the assumption that it is applied only to a stepper-type projection exposure apparatus which has a projection optical system including a lens system and effects exposure by stepwise movement of a wafer stage, it should be noted that the present invention is applicable to any type of projection exposure apparatus, for example, an exposure apparatus having a reflecting optical system, or a scanning projection exposure apparatus, without or with slight modification, in addition to the stepper-type projection exposure apparatus.

Incidentally, the foregoing embodiments of the present invention are arranged such that, when a pupil filter is exchanged (or leaded or unloaded), one or more optical lenses in the projection optical system PL is slightly moved to compensate for deterioration of the image-forming characteristics. However, there are cases where it is practically unnecessary to move optical lenses for compensation. That is, such fine adjustment of optical lenses may be unnecessary if the system is designed as follows: all pupil filters (including a simple plane-parallel vitreous material) which are to be inserted into the pupil plan FTP in the projection optical system PL are precisely produced with the same optical thickness, and optical design (production), particularly if aberration design of the projection optical system PL is made so that the best characteristics can be obtained on the premise that a transparent plate having the above optical thickness will be present on the pupil plane FTP.

By designing the projection optical system PL as described above, exposure can be carried out with high resolution maintained at all times with substantially no change in imaging aberration and image distortion when ordinary exposure is carried out (using a simple plane-parallel filter) and when special exposure is carried out (using filter for SFINCS, Super FLEX, etc.). Hence, it becomes possible to produce IC patterns of high accuracy.

Thus, according to the present invention, a plurality of different types of pupil filters can be exchangeably used in a single projection exposure apparatus. In addition, secondary image-forming characteristic change, particularly aberration variation, which results from exchange of each pupil filter, can be compensated by the action of an optical element moving device. Thus, favorable image-forming performance can always be obtained for any type of pupil filter. Consequently, it becomes possible to use a single projection exposure apparatus for a plurality of different types of pattern exposure process under optimum conditions. Thus, it is possible to further increase the efficiency of production of semiconductor integrated circuits, liquid crystal displays, etc.

Further, according to the present invention, even if there are some errors in production of a pupil filter which is to be used, it is possible to compensate for deterioration of image-forming characteristics (particularly aberrations), including the influence of the production errors. Therefore, the pupil filter production cost can be reduced to a considerable extent.

The projection exposure apparatus of another embodiment transfers a pattern drawn on a pattern surface, which 18 defined on the lower side (projection optical system side) of a reticle, onto a water through a projection optical system by the stepper method.

Figure 7:
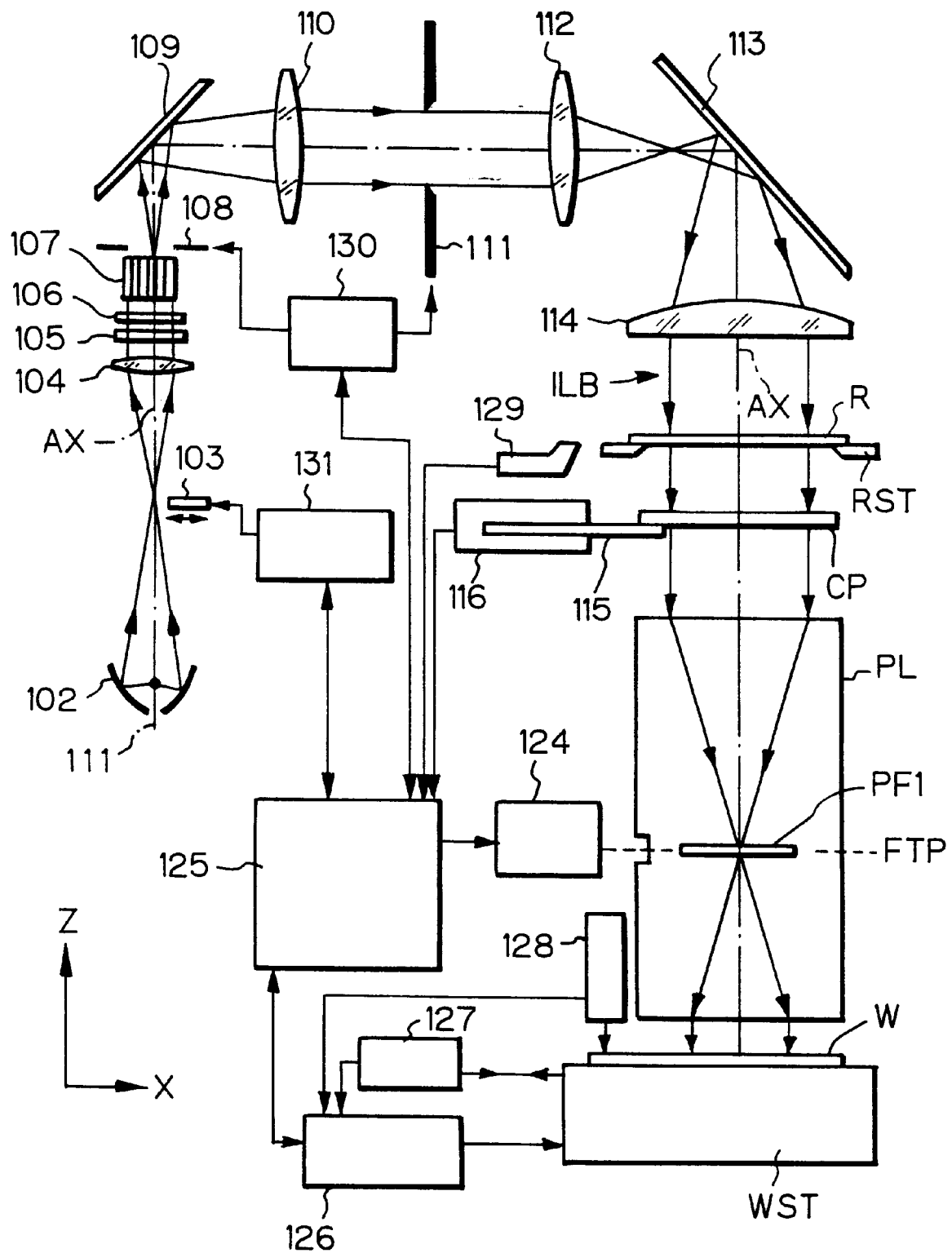
FIG. 7 shows the arrangement of another embodiment of the projection exposure apparatus according to the present invention.

FIG. 7 shows the projection exposure apparatus of this embodiment. Referring to FIG. 7, illuminating light beam emitted from a light source 101, which is a mercury vapor lamp, enters an interference filter 106 through an elliptical mirror 102, a collimator lens 104 and a short-wavelength cut filter 105. The interference filter 106 selects illuminating light ILB consisting of only the i-line (wavelength: 0.365 μm), for example, and the illuminating light ILB then enters a fly-eye lens 107. The illuminating light is selectively passed or intercepted under the control of a shutter 103 which is disposed in the vicinity of the secondary focal point of the elliptical mirror 102. It should be noted that the illuminating light ILB is not necessarily limited to the i-line, and a wavelength other than the i-line or a plurality of wavelengths may be used. Further, the light source lot for exposure is not necessarily limited to an emission line lamp such as a mercury-vapor lamp. For example, an excimer laser light source, a metal vapor laser or YAG laser harmonic generator, etc. may be used.

The exit-side surface of the fly-eye lens 107 forms a Fourier transform plane in the illuminating optical system with respect to the reticle pattern, where a surface illuminant image (i.e., a plane composed of the set of a plurality of point light sources corresponding to the element lenses of the fly-eye lens 107) is formed, and where an aperture stop of an illuminating system (hereinafter referred to as "σ stop") 108, which defines the shape and size of the surface illuminant image, is also provided.

The illuminating light emanating from the fly-eye lens 107 and passing through the a stop 108 illuminates a reticle R on a reticle stage RST via a mirror 109, a first relay lens 110, a reticle blind (field stop) 111, a second relay lens 112, a mirror 113 and a condenser lens 114. The reticle blind 111 is placed in conjugate relation to the pattern surface of the reticle R with respect to a composite system of the relay lens system 112 and the condenser lens 114. Thus, the illuminating field on the reticle R can be varied by the action of the reticle blind 111. The first relay lens system 110 is set so that the σ stop 108 (surface illuminant image) forms a Fourier transform plane with respect to the reticle blind 111 or the pattern surface of the reticle R.

A filter correcting member CP for correcting image-forming characteristics is disposed between the reticle R and the projection optical system PL. The filter correcting member CP is secured to a load arm 115 which is controlled by a load arm controller 116. The filter correcting member CP may be exchanged for another filter correcting member according to need. The action and effect of the filter correcting member CP will be described later. The bundle of rays passing through the filter correcting member CP is converged to form an image of the pattern of the reticle R on a wafer W. It should be noted that in FIG. 1 the optical pain from the reticle R to the wafer W shows a chief ray in a bundle of image-forming rays from each pattern on the reticle R. In this embodiment, a pupil plane FTP in the projection optical system PL, i.e., an optical Fourier transform plane with respect to the reticle R, is set so as to lie in a hollow space (where no lens or other element is present) between the reticle R and the wafer W, and a pupil filter PF1 is provided on the pupil plane FTP or a plane neighboring to it. The pupil filter PF1 will also be described later. Although the system shown in FIG. 7 employs Koehler illumination in which the position of the pupil plane FTP (conjugate to the surface illuminant image defined by the σ stop 108) in the projection optical system PL is conjugate to the light source 101, it should be noted that the illumination method is not necessarily limited to the Koehler illumination. In FIG. 1, a Z-axis is taken in a direction parallel to the optical axis AX of the projection optical system PL, a Y-axis is taken in a direction perpendicular to the plane of FIG. 1 in a plane perpendicular to the Z-axis, and an X-axis is taken in a direction parallel to the plane of FIG. 7.

The wafer W is retained on a holder of a wafer stage WST which is adapted to move two dimensionally in an XY-plane perpendicular to the optical axis AX. The position of the wafer stage WST is accurately measured at all times by a length measuring device, e.g., a laser interferometer 127. A wafer alignment system 128 detects the position of alignment mark (registration mark) formed on the water W or a positional error. A stage controller 126 controls a motor for driving the wafer stage WST on the basis of the value detected by the wafer alignment system 228 and the value measured by the laser interferometer 127, thereby setting the wafer W to an accurate exposure position. A main control system 125, which controls operations in the entire apparatus, supplies the stage controller 126 with information about a target position and other necessary information.

The main control system 125 also sends commands to a shutter controller 131, an illuminating system controller 130, etc. The shutter controller 131 controls the opening and closing operation of the shutter 103, which is disposed in the vicinity of the secondary focal point of the elliptical mirror 102. The illuminating system controller 130 controls the aperture setting of the σ stop 108 and the reticle blind 111. Further, the main control system 125 sends a command indicating a pupil filter to be set to a pupil filter exchange controller 124, which commands a pupil filter exchanging mechanism to exchange one pupil filter for another. The main control system 125 is also supplied with information from a bar code reader 129 that reads a type of reticle.

Figure 8:
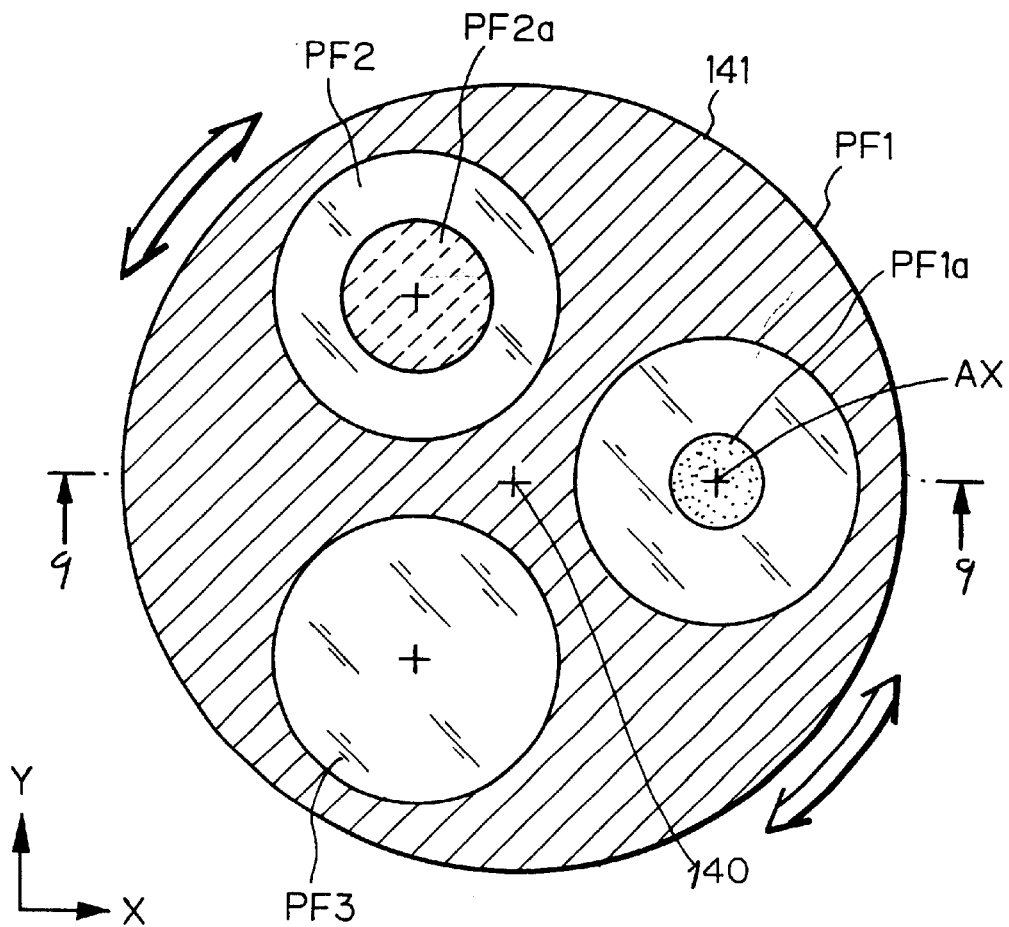
FIG. 8 is a plan view showing pupil filters as shown in FIG. 7, together with a pupil filter exchanging mechanism.

FIG. 8 is a plan view showing pupil filters and a pupil filter exchanging mechanism. In FIG. 8, three different types of pupil filters PF1, PF2 and PF3 are retained on a rotating plate 141 at regular spacings of 120°. The rotating plate 141 is rotatable about a rotating shaft 140 which is attached to an approximately central portion of the reverse side of the rotating plate 141. It is assumed that, in the state illustrated in FIG. 8, a Super FLEX pupil filter PF1, which inverts the phase of light passing through a central circular area PF1a with respect to the phase of light passing through an annular zone surrounding the circular area PF1a, has been loaded on the pupil-plane in the image-forming optical path of the projection optical system PL as a pupil filter which is suitable for exposure of contact hole patterns. The phase inversion may be effected either continuously or stepwisely.

Figure 9:
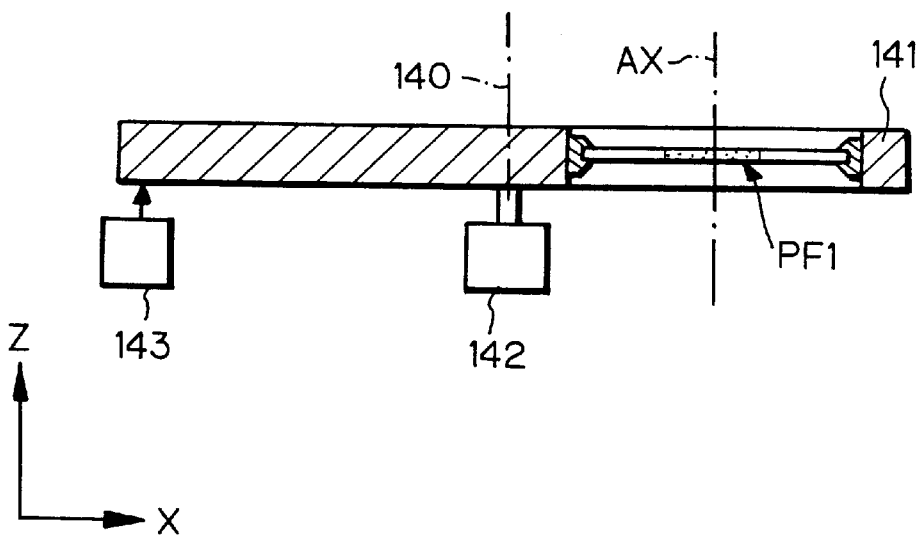
FIG. 9 is a sectional view taken along the line 9—9 line in FIG. 8.

FIG. 9 is a sectional view taken along the line 9—9 in FIG. 8, showing the mechanism (140 to 142) for exchanging the pupil filters PF1 to PF3. The rotating plate 141 is caused to rotate about the rotating shaft 140 by a rotation driving unit 142 provided on the rotating shaft 140. The rotation driving unit 142 is retained by a projection optical system lens mount (not shown). In addition, an encoder 143 is provided to accurately measure the rotational position of the rotating plate 141. The rotary encoder 143 outputs a signal corresponding to the angle of rotation of the rotating plate 141. Further, the rotating plate 141 has alignment grating patterns (scale patterns) cut in the peripheral edge thereof.

Referring to FIG. 8, the Super FLEX pupil filter PF1 is formed, for example, from a transparent flat plate of glass, quartz, etc. which has a transparent dielectric film formed over its central circular area PF1a. The pupil filter PF1 is arranged so that a phase difference of 180° is produced between a bundle of rays passing through the circular area PF1a and a bundle of rays passing through the area surrounding circular area PF1a. Of the other two pupil filters, the filter PF2 is arranged such that the transmittance of a circular area PF2a defined in the center of the filter PF2 is lower than the transmittance of the area surrounding the circular area PF2a. The pupil filter PF2 is used for exposure of L&S patterns. The pupil filter PF2 is formed from a transparent flat plate having a semi-transparent light-absorbing member, e.g., a metal thin film, formed over its central circular area PF2a. It is even more preferable that, when a pupil filter for L&S patterns is to be used, the illumination of the reticle R by the illuminating optical system (101 to 114), shown in FIG. 7, should be effected by the so-called annular zone illumination method. Accordingly, the σ stop 108 in FIG. 7 is preferably adapted to be compatible with annular zone illumination. More specifically, the surface illuminant image is partially obscured by the σ stop 108 so that it is formed into an annular zone shape. Therefore, it is preferable to prepare a plurality of σ stops 108 having different aperture configurations and to arrange the system so that the σ stops 108 can be appropriately exchanged by an exchanging mechanism similar to the pupil filter exchanging mechanism as shown in FIG. 2.

The other filter PF3 is formed from a uniform transparent flat plate (i.e., plain glass) which gives neither a transmittance difference nor a phase difference over the entire surface thereof. That is, the filter PF3 provides a state equivalent to a state where no pupil filter is used (it should, however, be noted that the pupil filter PF3 corrects only the optical path length). The reason why such a filter PF3 is needed is that the other two pupil filters PF1 and PF2 are transparent plates each having a predetermined optical thickness; therefore, when neither of the pupil filters PF1 and PF2 is used, the optical characteristics must be compensated such that an optical thickness equal to that of the pupil filters PF1 and PF2 is ensured, that is, it is necessary to perform an operation of making the optical path length uniform.

For the same reason, it is preferable that the optical thicknesses of a plurality of pupil filters used in the present invention should be approximately equal to each other. However, in this embodiment, variation of the image-forming characteristics (i.e., increase in aberration) caused by exchange of pupil filters can be minimized by changing the filter correcting member CP in accordance with each pupil filter. Therefore, the tolerance for variation in optical thicknesses of a plurality of pupil filters can be increased to some extent. The exchange of pupil filters causes variation of various optical aberrations due to variation of errors in production of pupil filters in particular.

Figure 10:
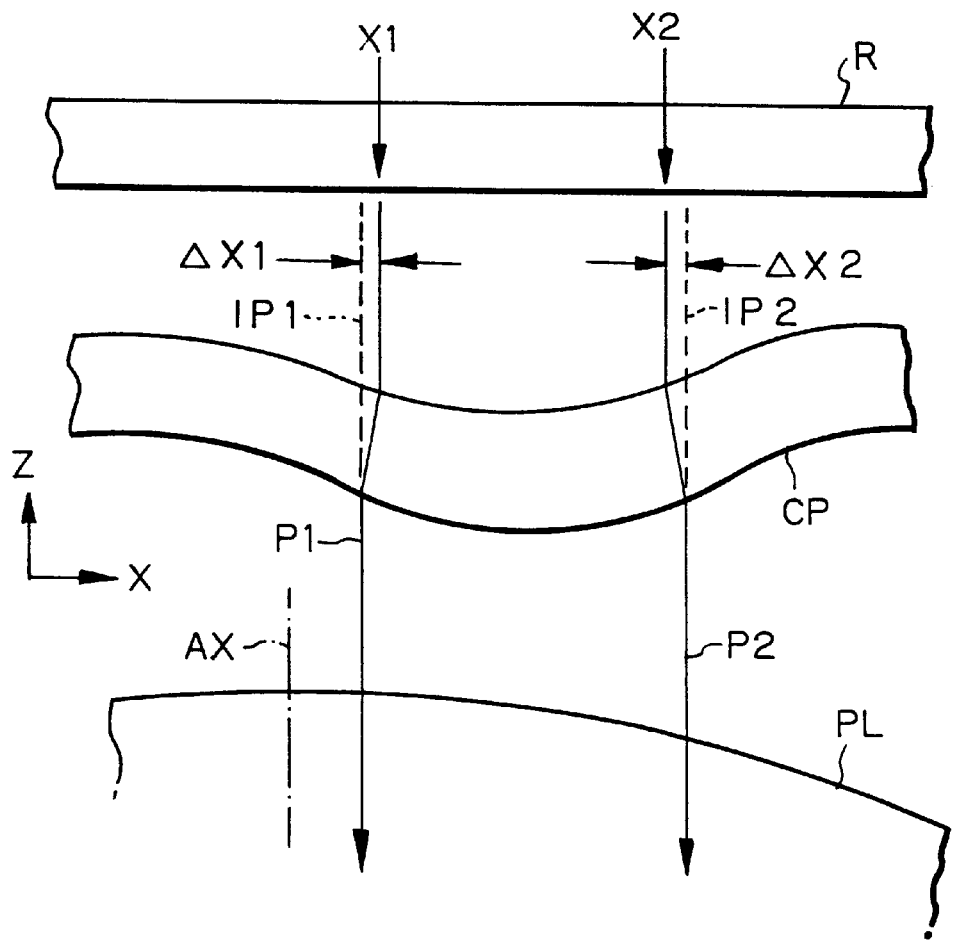
FIG. 10 illustrates the way in which distortion is corrected by a filter correcting member in the present invention.

FIG. 10 is an enlarged view showing a part of the filter correcting member CP used in this embodiment. In FIG. 10, the filter correcting member CP is a light-transmitting substrate of glass or other similar material which has an approximately uniform thickness. The light-transmitting substrate is locally deflected slightly in a concave or convex shape toward the surface of the reticle R. The filter correcting member CP is particularly effective for correction of distortion. The deflection of the filter correcting member CP functions as follows: For example, at a position corresponding to a position X1 on the reticle R, a bundle of image-forming rays (principal ray) P1, which is parallel to the optical axis AX from the reticle R, is refracted as shown in FIG. 4 when entering and emanating from the filter correcting member CP on account of the refractive index thereof which is different from that of the ambient gas. Then, the image-forming ray bundle P1 travels along the same optical path as that of a principal ray IP1 which would emanate from a position on the reticle R shifted by ΔX1 when the filter correcting member CP is not present. That is, the deflection of the filter correcting member CP causes the reticle pattern image-forming position to be shifted by ΔX1. At a position X2 which is in reverse relation to the position X1 in terms of the direction of deflection, the direction of shift ΔX2 of the image-forming position is also opposite to that of the shift at the position X1.

Figure 11:
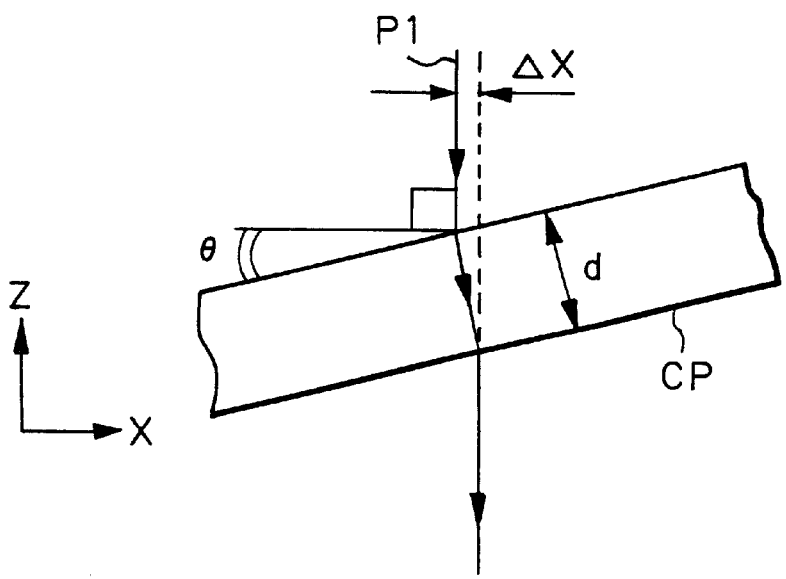
FIG. 11 shows a part of the filter correcting member shown in FIG. 10.

FIG. 11 shows a part of the filter correcting member CP as shown in FIG. 10. Referring to FIG. 11, in general, the image-forming position at each position (position relative to the optical axis AX of the projection optical system) is shifted approximately by $\Delta X = d(1-1/n)\sin\theta$ by the action of the filter correcting member CP which is inclined at θ with respect to a plane perpendicular to the image-forming ray bundle P1, and which has a thickness d and a refractive index n. Accordingly, distortion of the projection optical system PL can be canceled by previously measuring distortion (including random variation of the image-forming position) of the projection optical system PL in a state where each pupil filter is loaded, and producing a filter correcting member CP which is deformed (deflected) so as to correct the distortion, and then disposing the filter correcting member CP between the reticle R and the projection optical system PL or in the projection optical system PL. It is preferable that, in the measurement of distortion, a plane-parallel plate having the same optical thickness as that of the filter correcting member CP should be temporarily disposed at the same position as the position where the filter correcting member CP is to be set.

It should be noted that, in FIG. 10, bundles of rays from the reticle R include not only the image-forming ray bundles P1 and P2 of principal rays but also ray bundles which are at an angle to the image-forming ray bundles P1 and P2. Accordingly, even ray bundles which emanate from the same position on the reticle R differ from each other in the position of incident on the filter correcting member CP according to the exit angle. Further, since the inclination θ of the filter correcting member CP differs according to the position, the amount of shift of the image-forming position undesirably varies according to the angle of emergence from the filter correcting member CP (i.e., the image quality deteriorates). However, distortion which is to be corrected is, by nature, not so large. Therefore, the amount of deflection (θ) of the filter correcting member CP and the variation of the deflection according to the position are not so large. Further, the range in which ray bundles emerge from the reticle R can also be set to a level at which there is substantially no adverse effect on the image quality by setting the filter correcting member CP sufficiently close to the reticle R. The reason for this is as follows: Assuming that the image-forming magnification is 1/5 and the wafer-side numerical aperture is 0.6, the effective numerical aperture of ray bundles which enter the projection optical system PL from the reticle side is as small as about 0.6/5 (wafer-side numerical aperture/image-forming magnification).

Figure 12:
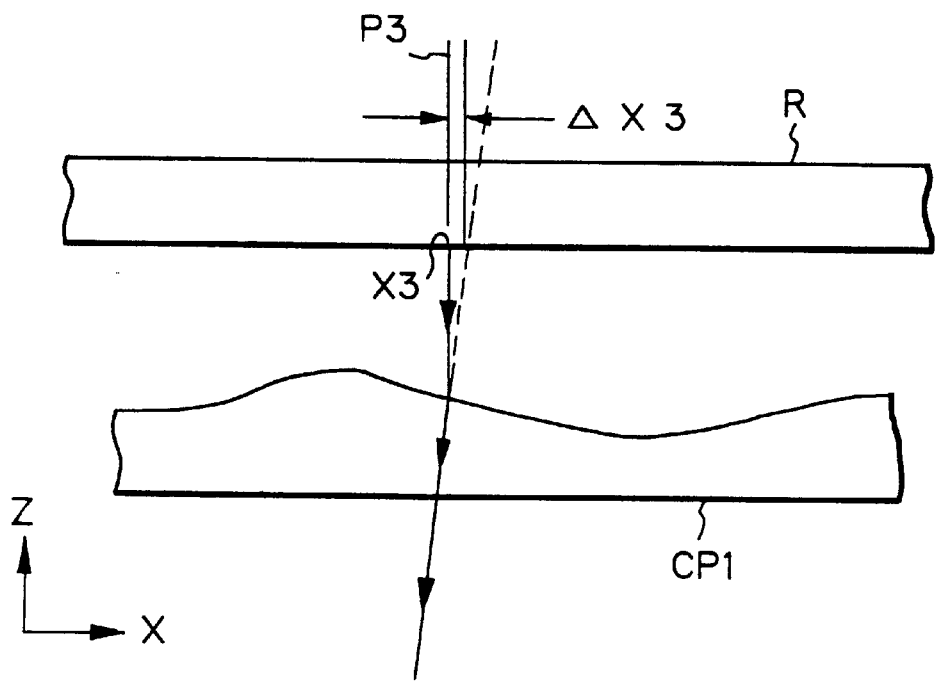
FIG. 12 is a fragmentary sectional enlarged view showing another example of the filter correcting member used in the embodiment of the present invention.

FIG. 12 is a fragmentary sectional view showing another example of the filter correcting member used in this embodiment. The filter correcting member CP1 shown in FIG. 12 is a light-transmitting plate which varies in thickness according to position. The filter correcting member CP1 is a light-transmitting plate which has a flat surface on one side (projection optical system side) thereof and an uneven surface on the other side (reticle side) thereof so that ray bundles which pass through the filter correcting member CP1 are refracted by the uneven surface. For example, at a position corresponding to the position X3 on the reticle R (i.e., the point of intersection between a principal ray passing through the position X3 and the surface of the filter correcting member CP1), a principal ray P3 is refracted by the filter correcting member CP1 which is inclined with respect to a plane perpendicular to the principal ray P3. As a result, principal ray P3 emanating from the filter correcting member CP1 behaves as if it were a ray emanating from a position which is ΔX3 away from the position X3 on the reticle R. Consequently, the filter correcting member CP1 shown in FIG. 6 enables the distortion to be corrected by ΔX3 in the same way as in the case of the filter correcting member CP, which is a plane-parallel plate.

Figure 13:
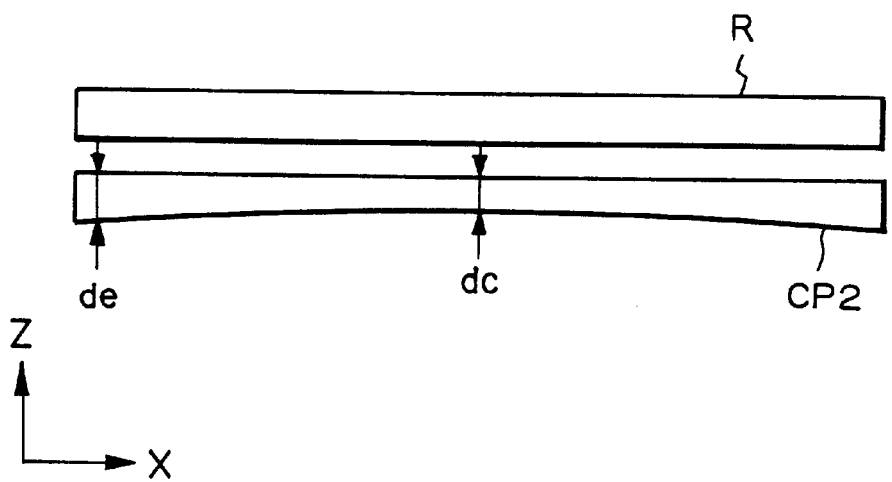
FIG. 13 is a sectional view showing still another example of the filter correcting member used in the embodiment of the present invention.

FIG. 13 shows still another example of the filter correcting member used in this embodiment. As shown in FIG. 13, the filter correcting member CP2 is a member in which the thickness "dc" of the central portion is smaller than the thickness "de" of the peripheral portion, that is, a concave lens of weak refractive power. By disposing such a concave (or convex) lens in the vicinity of the reticle R, it is possible to change mainly the curvature of field in the projection optical system. In this case, the magnification of image formation also somewhat changes. However, the change of the magnification can be compensated by a lens controller (a mechanism for controlling the image-forming magnification, etc. by changing the gas pressure in the space between lens elements) disclosed, for example, in U.S. Pat. No. 4,871,237, which has already been used in many projection exposure apparatuses.

The above-described filter correcting members CP1 and CP2, shown in FIGS. 12 and 13, should also be produced on the basis of the value of distortion or field curvature previously measured by temporarily disposing a plane-parallel plate having approximately the same optical thickness as each of the filter correcting members CP1 and CP2 at the same position where the filter correcting member is to be set.

Further, when a pupil filter disposed on the pupil plane in the projection optical system is exchanged for another, the amount of distortion, etc. also changes. Therefore, the filter correcting member CP shown in FIG. 1, for example, should be produced for each of various types of pupil filter, and the filter correcting member CP should also be exchanged when a pupil filter is exchanged for another. That is, as shown in FIG. 7, the filter correcting member CP is exchanged for another according to need through the load arm controller 116 and the load arm 115 in response to a command from the main control system 125. Selection and exchange of the filter correcting member CP are also carried out in response to a command from the main control system 125.

It is, of course, possible to use a filter correcting member exchanging mechanism that uses a rotating plate which is similar to a pupil filter exchanging mechanism such as that shown in FIG. 8. It should be noted that a filter correcting member CP which is to be selected is uniquely determined by the type of pupil filter used. A command as to which pupil filter should be used for exposure can be appropriately input to the main control system 125 by the operator through a console (not shown) or other similar device. However, since a type of appropriate pupil filter is solely determined by the type of reticle pattern to be transferred, filters may be automatically exchanged by reading the name, code or the like of a reticle R to be used with the bar code reader 129 or the like, and determining a type of pupil filter to be used on the basis of the recognized name or code. In this case also, the filter correcting member CP is also exchanged according to the selected pupil filter, as a matter of course.

Incidentally, pupil filters which are applicable to this embodiment are not necessarily limited to the above-described three types. It is also possible to use other types of pupil filter: for example, a light-blocking pupil filter of the type that blocks light in a circular area in the vicinity of the optical axis, as described above; and a pupil filter based on the SFINCS method [disclosed by the assignee in U.S. patent application Ser. No. 128,685 (Sep. 30, 1993)], which is designed to reduce the spatial coherence of a bundle of image-forming rays passing through the pupil plane. Although in the foregoing embodiment all the pupil filters use a transparent substrate with an optical thickness as a base, the present invention is not necessarily limited to the described arrangement. For example, the light-blocking pupil filter may be a light-blocking plate formed by hollowing out a light-blocking metal plate such that only a portion that is to serve as a light-transmitting portion is removed, with a central circular area left as it is. Such a light-blocking plate is detailed in the above-mentioned U.S. patent application Ser. No. 076,429 (Jun. 14, 1993) filed by the assignee. In a case where such a light-blocking pupil filter is used for contact hole patterns, in order to realize "a state where no pupil filter is used" as in the conventional practice, a filter having no optical thickness is used according to the same idea as that in the foregoing embodiment.

That is, the aforementioned transparent parallel plate with a uniform thickness (a pupil filter PF3 in FIG. 8) is not used as a pupil filter for conventional states. A light-blocking pupil filter may simply be removed from a pupil plane FTP.

Incidentally, in an optical projection system wherein aberrations are completely removed, any subsidiary change in image formation characteristics does not exist principally forwardly and rearwardly of the position where such a light-blocking metal pupil filter having no optical thickness is provided. However, in an actual projection optical system, aberrations slightly remain due to heterogeneity of glass, slight manufacturing errors of the respective lens elements, etc. As a matter of course, with respect to such a residual aberration, in the final adjustment stage, the relative positions, etc. between the respective optical elements are finely adjusted and the respective aberration on the image formation characteristics between a reticle R and a wafer W is restrained to an extent wherein there are no practical problems. However, it is difficult for the spaces between the pattern surface of the reticle R and the pupil surface FTP and between the pupil surface FTP and the surface of the wafer W to be adjusted into strict optical Fourier transform relations while the image formation characteristics are maintained. As far as the image characteristics are considered most important, there may be a case which does not satisfy the optical Fourier transformation relation strictly.

As mentioned above, in the projection optical system wherein the Fourier transformation relation cannot be maintained strictly, there are some possibility that subsidiary image formation characteristics (especially distortion) might be changed with respect to the installation of the light-blocking pupil metal filter. However, the filter correcting member CP of the present embodiment can, of course, compensate for the aberration fluctuation.

Incidentally, in the aforementioned embodiment, as a projection exposure apparatus, what we call, a stepper type projection exposure apparatus is applied. The stepper type projection exposure apparatus comprises a projection optical system which is made up of lens systems and exposures by means of the step movements of the wafer stage. However, the present invention can be applied to projection exposure apparatuses of any types such as a projection exposure apparatus made up of reflecting optical systems and a scan-type projection exposure apparatus, etc. Incidentally, for example, in a case wherein the pupil filter exchange mechanism is not provided and a pupil filter is simply inserted and removed, the filter correcting member for distortion correction may be inserted and removed in association with the movement of the pupil filter.

Thus, the present invention is not necessarily limited to the above-described embodiment but may adopt various arrangements without departing from the spirit of the present invention.

Figure 14:
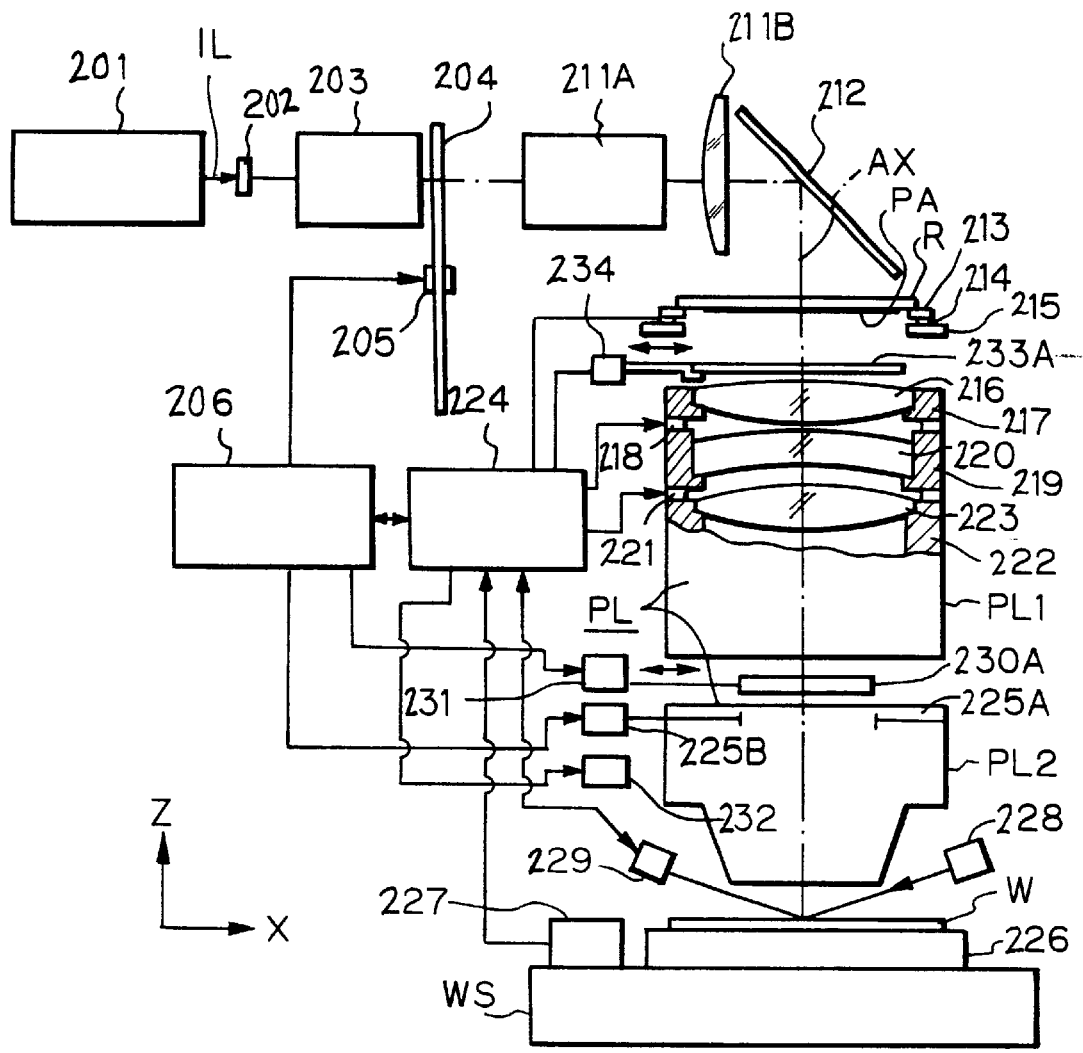
FIG. 14 is a partly-cutaway schematic view showing the arrangement of another embodiment of the projection exposure apparatus according to the present invention.

Next, another embodiment of the projection exposure apparatus according to the present invention will be described with reference to FIGS. 14 to 22. FIG. 14 schematically shows the arrangement of a projection exposure apparatus according to the second embodiment. Referring to FIG. 14, a super-high pressure mercury vapor lamp 201 emits illuminating light (e.g., i-line) IL in a wavelength range in which a photoresist layer used satisfactorily exhibits its sensitivity to the illuminating light IL to form a photoresist pattern. The illuminating light source for exposure is not necessarily limited to an emission line lamp such as a mercury-vapor lamp. It is also possible to use laser light sources, e.g., KrF or ArF excimer laser, or higher harmonics, e.g., YAG laser. The illuminating light IL passes through a shutter 202 that selectively opens or closes the optical path of the illuminating light IL. Then, the illuminating light IL enters an illuminance distribution uniforming optical system 203 which includes a collimator lens and an optical integrator (fly-eye lens).

Figure 18:
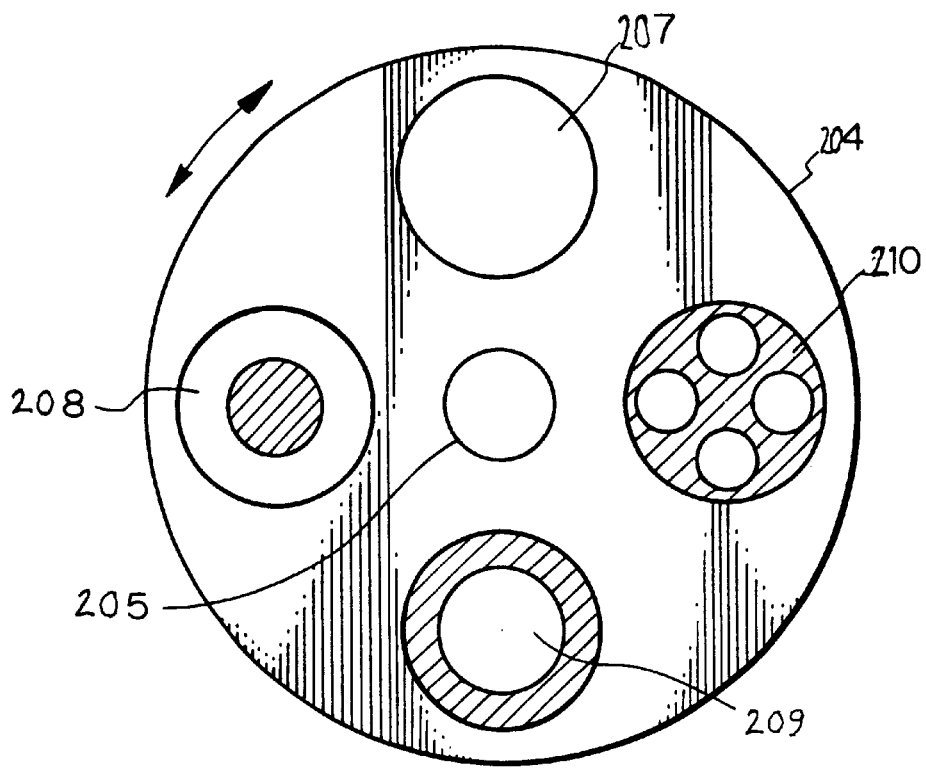
FIG. 18 is an enlarged plan view showing one example of an aperture stop disposed on a turret plate in the arrangement shown in FIG. 14.
Figure 19:
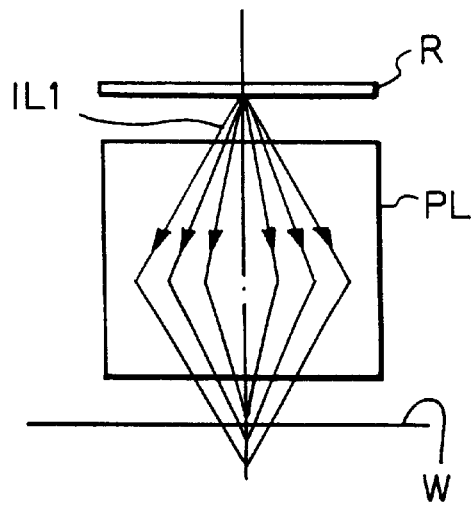
FIG. 19(a) and 19(b) illustrate the way in which image-forming characteristics change depending upon the illuminating light intensity distribution at a pupil plane in the projection optical system.
Figure 19:
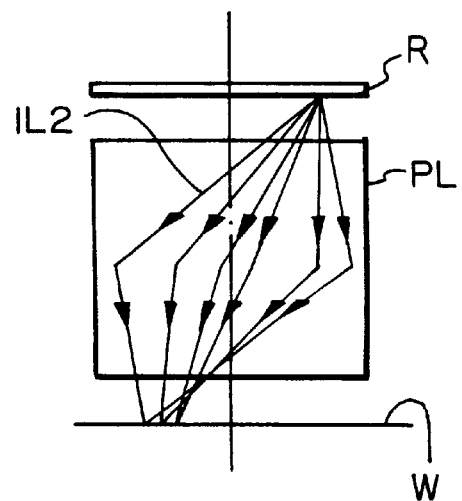

A large number of light source images are formed on the exit surface of the illuminance distribution uniforming optical system 203. An aperture stop which is provided on a turret plate 204 is disposed on the exit surface of the illuminance distribution uniforming optical system 203. As shown in FIG. 18, the turret plate 204 has the following four aperture stops disposed thereon: an ordinary aperture stop 207 (for increasing the numerical aperture of the illuminating system, that is, for increasing the σ value, which is a coherence factor); an annular stop 208 for annular zone illumination; a relatively small aperture stop 209 (for reducing the numerical aperture of the illuminating system, that is, for reducing the σ value); and an aperture stop 210 for modified light source, which has four relatively small circular openings disposed eccentrically with respect to each other. Referring to FIG. 14, a main control system 206 controls the angle of rotation of the turret plate 204 through a driving motor 205, thereby allowing a desired aperture stop to be set on the exit surface of the illuminance distribution uniforming optical system 203. The main control system 206 selects an optimal aperture stop by taking into consideration the type of reticle pattern as an object or exposure (e.g., information as to whether or not a phase shifter is present, and information as to whether a periodic pattern or an isolated pattern is present) and reticle pattern forming conditions (line width, pitch, duty, etc.). The change of an aperture stop is the change of illuminating conditions for the reticle R.

After passing through an aperture stop of the turret plate 204, the illuminating light IL passes through a relay optical system 211A, which is composed of a first relay lens, a field stop, and a second relay lens, and further through a condenser lens 211B to reach a mirror 212, at which the illuminating light IL is reflected approximately vertically downward. The reflected illuminating light IL illuminates the pattern area PA of the reticle R at an approximately uniform illuminance. The reticle R is held by a reticle holder 213. The reticle holder 213 is mounted on a reticle stage 215 which is movable two dimensionally in a horizontal plane, through a plurality (only two are illustrated in FIG. 14) of stretchable driving elements (e.g., piezoelectric elements). In this embodiment, a sub-control system 224 controls the amount of expansion and contraction of each driving element 214, thereby enabling the reticle R to be moved parallel to the optical axis AX of the projection optical system PL and also tilted in any desired direction with respect to a plane perpendicular to the optical axis AX. With the above-described arrangement, it is possible to correct image-forming characteristics of the projection optical system PL, particularly pincushion distortion and barrel form distortion, as will be detailed later. It should be noted that the reticle R is positioned so that the central point in the pattern area PA coincides with the optical axis AX.

The projection optical system PL is disposed below the reticle R. The projection optical system PL is composed of a first-projection optical system PL1 and a second projection optical system PL2, which are disposed in the mentioned order from the reticle side. In this embodiment, a distortion correcting plate 233A is installed between the reticle R and the first projection optical system PL1 through a loader 234 according to need. The sub-control system 224 controls loading and unloading of the distortion correcting plate 233A through the loader 234. The loader 234 also enables the distortion correcting plate 233A to be exchanged for another distortion correction plate. The distortion correcting plate 233A and another distortion correcting plate are each formed by polishing the whole or only a part of a glass substrate into a spherical or a spherical surface, and used to correct distortion as one of image-forming characteristics.

After passing through the pattern area PA of the reticle R and further through the distortion correcting plate 233A (when it has been inserted), the illuminating light IL enters the projection optical system PL, which is telecentric on both sides. The projection optical system PL projects (forms) an image of the circuit pattern of the reticle R onto a wafer W, which has a photoresist layer formed on the surface thereof, and which is held so that the surface is approximately coincident with the best focus plane, such that the projected image of the circuit pattern is superimposed on one shot area on the wafer W. Further, in this embodiment, the projection optical system PL is arranged so that some lens elements (in FIG. 14, lens elements 216 and 220) which constitute the projection optical system PL can be driven independently of each other, thereby making it possible to correct image-forming characteristics of the projection optical system PL, for example, projection magnification, distortion, field curvature, astigmatism, etc. (detailed later). In addition, a variable aperture stop 225A is provided on a pupil plane (a Fourier transform plane with respect to the reticle R) in the projection optical system PL or on a plane in the neighborhood of the pupil plane. The main control system 206 controls the aperture of the variable aperture stop 225A through a driver 225B, thereby enabling the numerical aperture NA of the projection optical system PL to be changed.

Further, the pupil plane or the neighboring plane is disposed between the first and second projection optical systems PL1 and PL2, and the pupil filter 230A is inserted in the pupil plane or the neighboring plane. The main control system 206 for controlling image-forming conditions and other operating conditions controls loading and unloading of the pupil filter 230A through a loader 231. The pupil filter 230A is, for example, a light-blocking filter such as that shown in FIG. 17(a), which has a light-blocking portion 239 that blocks zeroth-order light from passing through a central area of the filter which includes the optical axis of the projection optical system PL, and a light-transmitting portion 240 that transmits diffracted light at a peripheral area surrounding the light-blocking portion 239. However, the pupil filter 230A may be replaced by a pupil filter 230B such as that shown in FIG. 17(b), which is arranged so that the optical path length difference with respect to the illuminating light between a central portion 241 through which zeroth-order light passes and a peripheral annular zone 242 through which diffracted light passes exceeds the coherence length. These pupil filters are generally used for exposure of isolated patterns (mainly contact hole patterns) in which advantageous effects cannot readily be obtained with superhigh resolution technique such as phase shift method, annular zone illuminating method, or modified light source method (SHRINC method). However, a pupil filter such as a filter for L&S pattern is effective for periodic patterns, as has already been described.

From the type of reticle pattern to be exposed and the pattern forming conditions, the main control system 206 judges the type of aperture stop in the turret plate 204 which is to be set, and also judges whether the pupil filter 230A is to be loaded or unloaded, or the type of another pupil filter to be used according to need. Then, the main control system 206 causes the turret plate 204 to rotate through the driving motor 205 to set the desired aperture stop, and also controls loading and unloading of the pupil filter 230A or setting of another pupil filter through the loader 231. However, selection of a combination of an aperture stop and a pupil filter may be made by the operator through a keyboard (not shown).

The wafer W is held on a wafer holder (θ table) 226 by the action of vacuum, and the wafer holder 226 is fixedly mounted on a wafer stage WS. A direction parallel to the optical axis AX of the projection optical system PL is taken as Z-axis, and an orthogonal coordinate system is set in a plane perpendicular to the Z-axis to define X- and Y-axes. In this case, the wafer stage WS is composed of a leveling stage for tilting the wafer W in any desired direction with respect to the best focus plane of the projection optical system PL, a Z stage for slightly moving the wafer W in the optical axis direction (Z-direction) of the projection optical system PL, and an XY stage for two-dimensionally positioning the wafer W in the XY-plane perpendicular to the optical axis AX of the projection optical system PL by the step-and-repeat method. Upon completion of transfer exposure of a pattern of the reticle R for one shot area on the wafer W, the wafer W is stepped to a subsequent shot position. Further, an exposure monitor 227, which is a photoelectric detector, is provided on the wafer stage WS such that the light-receiving surface of the monitor 227 is approximately coincident with the exposed surface of the wafer W.

For example, the exposure monitor 227 is a photoelectric detector having a light-receiving surface which has approximately the same area as that of the image field of the projection optical system PL, or the reticle pattern projection area. The exposure monitor 227 outputs and supplies a photoelectrically converted signal to the sub-control system 224. The signal output from the monitor 227 is used as basic data for obtaining an amount of change of the image-forming characteristics of the projection optical system PL.

Further, the arrangement shown in FIG. 14 includes an oblique incidence focus position detecting system which is composed of an irradiation optical system 228 that projects an image of a pinhole or a slit pattern, obliquely to the optical axis AX, onto the exposed surface of the wafer W in the vicinity of the best focus plane of the projection optical system PL, and a light-receiving optical system 229 that receives a bundle of rays of the projected image reflected from the surface of the wafer W through a slit. The focus position detecting system detects the position (focus position) in the Z-direction of the surface of the wafer W with respect to the best focus plane to detect the condition of focus of the wafer W with respect to the projection optical system PL. The light-receiving optical system 229 supplies the sub-control system 224 with a focus signal indicative of an amount of shift of the focus position of the wafer W with respect to the best focus plane. It is assumed in this embodiment that the focus position detecting system has previously been calibrated so that the best focus plane is zero, that is, the focus signal is 0 at the best focus plane. More specifically, calibration is carried out, for example, by adjusting the angle of a plane-parallel glass plate (not shown) which is provided in the light-receiving optical system 229.

This embodiment is also provided with a mechanism for correcting spherical aberration in the projection optical system PL. FIG. 16 shows in detail the arrangement of a part of the projection optical system PL (FIG. 14) in the vicinity of the pupil plane. In FIG. 16, a lens system 235 in the first projection optical system PL1 which is closest to the pupil plane FTP is supported in such a manner that it can be slightly moved in the direction of the optical axis AX through a driver 206. Similarly, a lens system 237 in the second projection optical system PL2 which is closest to the pupil plane FTP is supported such that it can be slightly moved in the direction of the optical axis AX through a driver 238. When the sub-control system 224 provides a controller 232 with data concerning the amount of correction required for spherical aberration, the controller 232 effects fine adjustment of the positions of the lens systems 235 and 237 through the respective drivers 236 and 238, thereby correcting spherical aberration. Since the positions of the lens systems 235 and 237, which are close to the pupil plane FTP, are finely adjusted, spherical aberration can be corrected even more accurately.

Incidentally, the projection exposure apparatus shown in FIG. 14 is provided with the sub-control system 224 which determines an amount of correction for image-forming characteristics of the projection optical system PL, and which controls each correcting mechanism so as to maintain the image-forming characteristics in a favorable condition at all times. Further, the projection exposure apparatus is provided with the main control system 206 which selects optimal exposure conditions according to the type of reticle pattern and the pattern forming conditions, together with the type of photoresist used, if necessary, and which controls each exposure condition changing mechanism, as has been described above.

Figure 15:
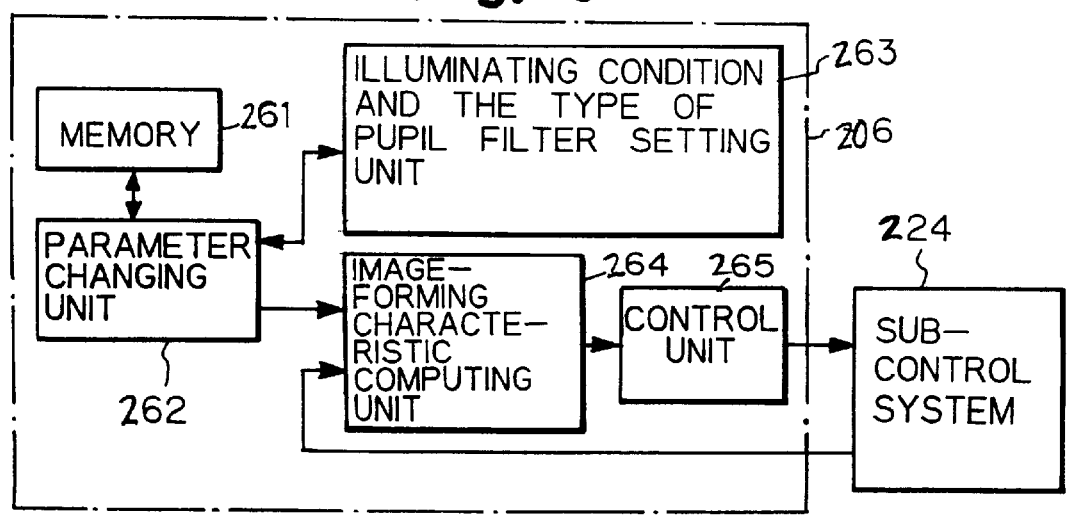
FIG. 15 is a functional block diagram showing the arrangement of a main control system used in the embodiment shown in FIG. 14.

FIG. 15 is a functional block diagram showing an essential part of the main control system 206. As shown in FIG. 15, an illuminating condition and pupil filter setting unit 263 first sets illuminating conditions (exposure conditions) and a pupil filter to be used. The set conditions are supplied to a parameter changing unit 262. The parameter changing unit 262 corrects parameters for image-forming characteristic computation, which are read out from a memory 261, according to the set conditions supplied, and supplies the corrected parameters to an image-forming characteristic computing unit 264. The image-forming characteristic computing unit 264 is also supplied with information related to illuminating light heat energy accumulated in the projection optical system PL from the sub-control system 224. Thus, the image-forming characteristic computing unit 264 calculates an amount of change of the image-forming characteristics magnification, distortion, position of best focus plane, etc.) of the image projected by the projection optical system PL on the basis of the corrected parameters and the heat energy, and supplies the calculated amount of change to the sub-control system 224 through a control unit 265. The sub-control system 224 corrects the image-forming characteristic change caused by the change of the exposure conditions on the basis of the information regarding the amount of change of the image-forming characteristics supplied from the control unit 265 in the main control system 206. Further, the sub-control system 224 corrects the image-forming characteristic change caused by changes in the environmental conditions, e.g., atmospheric pressure, atmospheric temperature, etc., and by absorption of illuminating light IL by the projection optical system PL. For this purpose, the main control system 206 is also supplied with measured data from an environment sensor (not shown) for measuring atmospheric pressure and temperature in the space surrounding the projection optical system PL.

Next, the image-forming characteristic adjusting mechanism (image-forming characteristic condition adjusting device) for the projection optical system PL in this embodiment will be explained. In this embodiment, the sub-control system 224 drives the reticle R and the lens elements 216 and 220 independently of each other through the respective driving elements, as shown in FIG. 14, thereby enabling the image-forming characteristics of the projection optical system PL to be corrected. The image-forming characteristics of the projection optical system PL include the best focus plane position, projection magnification, distortion, field curvature, spherical aberration, astigmatism, etc. Values for these characteristics can be corrected individually. In this embodiment, however, description will be made with regard to correction of the best focus plane position, projection magnification, distortion and field curvature in a projection optical system which is telecentric on both sides in particular, for simplification of the explanation. Further, in this embodiment, the barrel form or pincushion distortion is corrected by movement of the reticle R.

The lens element 216 of first lens unit that is closest to the reticle R is secured to a lens frame 217, and the lens element 220 of second lens unit is secured to a lens frame 219. A lens element 223 and others, which are below the lens element 220, are secured to a lens mount 222 for the first projection optical system PL1. It should be noted that in this embodiment the optical axis AX of the projection optical system PL is assumed to be the mutual optical axis of the lens elements which are secured to the lens mount 222.

The lens frame 217 is connected to the lens frame 219 through a plurality (e.g., three; two in the figure) of stretchable driving elements 218. The lens frame 219 is connected to the lens mount 222 through a plurality of stretchable driving elements 221. For example, electrostrictive elements (e.g., piezoelectric elements) or magnetostrictive elements may be used as the driving elements 214, 218 and 221. An amount of displacement of each driving element which correspond to the voltage or magnetic field applied to the driving element should be obtained in advance. In view of the hysteresis of the driving elements 214, 218 and 221, each driving element is provided with a position sensor (not shown), e.g., a capacitive displacement sensor, a differential transformer, etc., and the position of the driving element corresponding to the voltage or magnetic field applied thereto is monitored with the position sensor, thereby enabling the associated lens element to be driven with high accuracy.

When each of the lens elements 216 and 229 is moved parallel to the optical axis AX, the projection magnification M, the field curvature C and the best focus plane position F each change at a rate of change corresponding to the amount of movement of the lens element. Assuming that the amount of drive of the lens element 216 is $x_1$ and the amount of drive of the lens element 220 is $x_2$, the amount of change $\Delta M$ of the projection magnification M, the amount of change $\Delta C$ of the field curvature C, and the amount of change $\Delta F$ of the best focus plane position F may be given by $$\Delta M = C_{M1} \cdot x_1 + C_{M2} \cdot x_2 \qquad \text{(Eq. 1)}$$

$$\Delta C = C_{C1} \cdot x_1 + C_{C2} \cdot x_2 \qquad \text{(Eq. 2)}$$

$$\Delta F = C_{F1} \cdot x_1 + C_{F2} \cdot x_2 \qquad \text{(Eq. 3)}$$

It should be noted that the coefficients $C_{M1}'$ $C_{M2}'$ $C_{C1}'$ $C_{C2}$, $C_{F2}$ and $C_{F2}$ are constants which represent the rates of change of the change quantities with respect to the amounts of drive of the lens elements.

Incidentally, the focus position detecting system, which is composed of the irradiation optical system 228 and the light-receiving optical system 229, detects the amount of shift of the wafer surface with respect to the best focus plane of the projection optical system PL with the best focus plane position defined as zero, as has been described above. Accordingly, the shift of focus of each of the lens elements 216 and 220 caused by driving can be corrected by electrically or optically giving an appropriate offset $x_3$ to the focus position detecting system, and positioning the wafer surface by the focus position detecting system. At this time, Eq. (3) may be expressed by $$\Delta F = C_{F1} \cdot x_1 + C_{F2} \cdot x_2 + x_3 \qquad \text{(Eq. 4)}$$

Similarly, when the reticle R is moved parallel to the optical axis AX, the distortion D and the best focus plane position F each change at a rate of change corresponding to the amount of movement of the reticle R. Assuming that the amount of drive of the reticle R is $x_4$, the amount of change $\Delta D$ of the distortion and the amount of change $\Delta F$ of the best focus plane position F may be given by $$\Delta D = C_{D4} \cdot x_4 \qquad \text{(Eq. 5)}$$

$$\Delta F = C_{F1} \cdot x_1 + C_{F2} \cdot x_2 + x_3 + C_{F4} \cdot x_4 \qquad \text{(Eq. 6)}$$

It should be noted that the coefficients $CD_4$ and $CF_4$ are constants which represent the rates of change of the change quantities with respect to the amount of drive of the reticle R.

It will be understood from the above that the amounts of change $\Delta M$, $\Delta C$, $\Delta D$ and $\Delta F$ can be optionally corrected by setting the amounts of drive $x_1$ to $x_4$ in Eqs. 1, 2, 5 and 6. Although in the foregoing description four different kinds of image-forming characteristics are simultaneously corrected, it should be noted that the above-described correction need not be made, provided that the amount of change in the image-forming characteristics of the projection optical system PL caused by the absorption of illuminating light is so small as to be ignorable. On the other hand, when image-forming characteristics (e.g., spherical aberration) other than the four characteristics described in this embodiment change to a considerable extent, correction must be made for the image-forming characteristics by using, for example, the mechanism shown in FIG. 16.

Although in the foregoing description the reticle R and the lens elements 216 and 220 are moved to make parallel displacement, the reticle R can be tilted in any desired direction with respect to a plane perpendicular to the optical axis AX in actual practice by adjusting the amount of expansion and contraction of driving elements at three or four points around the peripheral edge of the reticle R. Similarly, the lens elements 216 and 220 can be tilted in any desired direction with respect to a plane perpendicular to the optical axis AX. By doing so, other image-forming characteristics can also be corrected.

In this embodiment, the sub-control system 224 can move the reticle R, the lens elements 216 and 220, and the lens systems 235 and 237. In particular, the lens elements 216 and 220 have large effects on image-forming characteristics such as projection magnification, distortion, field curvature and astigmatism in comparison to the other lens elements, and hence control can be readily effected. Similarly, the lens systems 235 and 237 have large effects on spherical aberration in comparison to the other lens elements. It should, however, be noted that the number of movable lens elements may be three or more, or the number of movable lens systems may be three or more. In such a case, it is possible to enlarge the movable range of lens elements or lens systems while suppressing variation of various other aberrations, and it is possible to cope with distortions of various forms (i.e., trapezoidal and rhombic distortions), field curvature, astigmatism, etc. By employing the image-forming characteristic adjusting mechanism having the above-described arrangement, it is possible to cope satisfactorily with variation of the image-forming characteristics of the projection optical system PL caused by the absorption of exposure light.

Although this embodiment uses an image-forming characteristic adjusting mechanism which is arranged to correct the image-forming characteristics by moving the reticle R, the lens elements 216 and 220, and the lens systems 235 and 237, as an example, as described above, it should be noted that the arrangement of an image-forming characteristic adjusting mechanism used in this embodiment is not necessarily limited to the above. For example, it is also possible to employ an arrangement in which a space which is sandwiched between two lens elements is hermetically sealed, and the pressure of gas in the sealed spaced is adjusted. Referring to FIG. 14, the sub-control system 224 controls loading, unloading and exchange of the distortion correcting plate 233A through the loader 234. The distortion correcting plate 233A is used to correct higher-order distortion, asymmetrical aberration component or random aberration component, which cannot satisfactorily be corrected by the above-described adjusting mechanism. Accordingly, the distortion correcting plate 233A has no versatility, and it cannot be employed as a mechanism for adjusting ordinary image-forming characteristics, but is used for initial adjustment. In this embodiment, distortion that is produced by use of a pupil filter is corrected by using the distortion correcting plate 233A synchronously with loading, unloading or exchange of the pupil filter 230A. Since loading or unloading of the pupil filter 230A also causes the best focus plane position and distortion (pincushion distortion or barrel form distortion) to change, as a matter of course, these characteristics must be corrected by the above-described image-forming characteristic adjusting mechanism.

Next, the principal operation of this embodiment will be explained. The projection optical system PL has essentially been corrected for aberration to a high degree. However, it is common for the projection optical system PL to have some aberration which cannot be removed for reasons of production, such as aberration (spherical aberration) in which the best focus plane position varies according to the position at which illuminating light IL1 passes through the pupil plane of the projection optical system PL, as shown for example in FIG. 19(a), or aberration (comatic aberration or spherical aberration) in which the exposure position varies according to the position at which illuminating light IL2 passes through the pupil plane of the projection optical system PL, that is, distortion which occurs with regard to rays not parallel to the optical axis varies according to the position on the pupil plane, as shown for example in FIG. 19(b). Accordingly, when the pupil filter 230A is inserted in the pupil plane of the projection optical system PL as in the case of this embodiment, the best focus plane position and distortion change. The exposure light intensity distribution at the pupil plane of the projection optical system PL also varies according to the conditions of the aperture stops 7 to 10 in the illuminating system and according to the condition of the aperture stop 225A on the pupil plane and the type of reticle R used.

Therefore, in this embodiment, the illuminating condition and pupil filter setting unit 263 in the main control system 206, shown in FIG. 15, posts information regarding these conditions to the parameter changing unit 262. The parameter changing unit 262 corrects the parameters read out from the memory 261 on the basis of the condition information sent thereto, and supplies the corrected parameters to the image-forming characteristic computing unit 264 to calculate a change of the image-forming characteristics. Then, the sub-control system 224 corrects the image-forming characteristics for the change calculated in the image-forming characteristic computing unit 264. The relationship between the illuminating conditions, the type of pupil filter, the condition of the aperture stop 225A and the type of reticle R on the one hand and the image-forming characteristics on the other is previously obtained by experiment or simulation and stored in the memory 261 in the main control system 206 in the form of a table or formula.

Although in the foregoing description the projection optical system PL is placed in static conditions, in actual practice it is subjected to atmospheric pressure change, temperature change, and image-forming characteristic changes caused by absorption of illuminating light IL by the projection optical system PL. The memory 261 in the main control system 206 has previously been stored with parameters for these changes. The image-forming characteristic computing unit 264 calculates an amount of change of the image-forming characteristics by using atmospheric pressure and temperature information from the environment sensor (not shown) and the parameters read out from the memory 261, and supplies the calculated amount of change to the sub-control system 224 through the control unit 265. In response to it, the sub-control system 224 makes correction so as to cancel the change of the image-forming characteristics. The parameters also need to be changed in accordance with other conditions, i.e., the illuminating conditions, the type of pupil filter, and the condition of the aperture stop 225A on the pupil plane. In this embodiment, the parameter changing unit 262 makes necessary change of parameters.

Among image-forming characteristic changes caused by various factors, an image-forming characteristic change caused by the absorption of illuminating light will be taken as an example, and correction of the image-forming characteristic change will be explained below. Although in the following description a change of the best focus plane position is taken as an example of a change of image-forming characteristics, the same applies to magnification, distortion, etc.

Figures 20A, 20B:
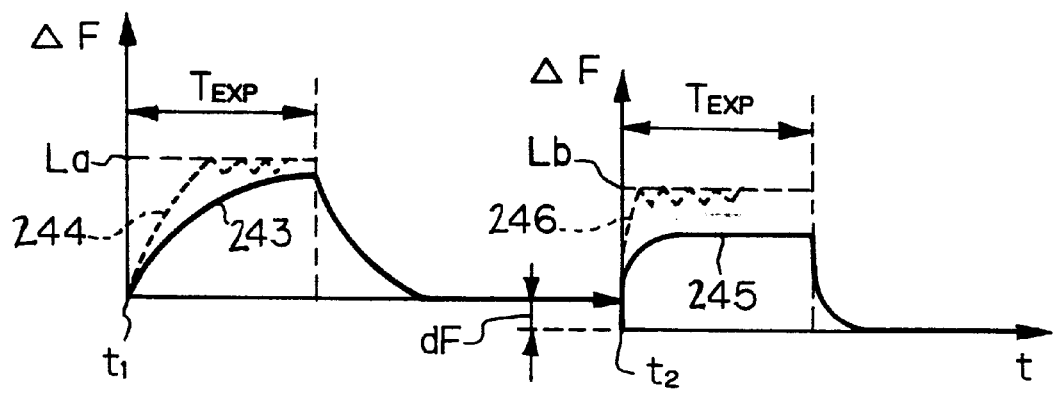
FIG. 20(a) and 20(b) show a change in the amount of shift of the best focus plane when the operating condition is changed from an exposure condition where no pupil filter is present through an exposure suspending condition to an exposure condition where a pupil filter is present.

FIG. 20(a) shows best focus plane position change characteristics in a state where the pupil filter 230A is not inserted in the projection optical system PL. If an exposure operation is started from time $t_1$, the projection optical system PL gradually absorbs illuminating light IL as time t elapses. Consequently, the amount of shift $\Delta F$ of the best focus plane position with respect to the initial position gradually increases, as shown by the curve 243. In actual practice, the curve 243 is not so smooth as shown in FIG. 20(a) because of the driving operation based on the step-and-repeat method and the wafer exchanging operation. However, the illustrated curve 243 is approximately correct from the qualitative point of view. When a predetermined exposure time $T_{EXP}$ terminates, the exposure is suspended. Thereafter, the amount of shift $\Delta F$ of the best focus plane position gradually returns to zero.

That is, the amount of shift $\Delta F$ during exposure may be approximately expressed by $$\Delta F = a_{P1}(1 - \exp(-t/T_{P1})) \qquad \text{(Eq. 7)}$$

where $T_{P1}$ is a predetermined time constant, and a is a coefficient.

In contrast, FIG. 20(b) shows the change of the amount of shift $\Delta F$ of the best focus plane position when the projection optical system PL has the pupil filter 230A inserted therein. In this case, if an exposure operation is started from time $t_2$, the amount of shift $\Delta F$ changes as shown by the curve 245 in the same way as the curve 243 in FIG. 20(a). However, the change characteristics are slightly different from each other. The difference in the origin for the amount of shift $\Delta F$ (i.e., the amount of shift when there is no effect of the absorption of illuminating light) is due to the difference in the illuminating light distribution at the pupil plane of the projection optical system PL. The illuminating light absorption change characteristics may be expressed by the magnitude of the amount of shift $\Delta F$ for the same illuminating light energy measured by the exposure monitor 227 in FIG.

14) E, ΔF/E, and the rise characteristics of the curves shown in FIGS. 20(*a*) and 20(*b*). The two different characteristics should be previously obtained by experiment or the like, stored in the memory 261 as parameters, and changed by the parameter changing unit 262 when the conditions have changed.

Specific examples of the parameters are the time constant $T_{P1}$ and the coefficient $a_{P1}$ in Eq. (7). Accordingly, when the pupil filter 230A is used, the time constant $T_{P1}$ and the coefficient $a_{P1}$ are changed to $T_{P2}$ and $a_{P2}$, respectively, and the new time constant and coefficient are applied to Eq. (7). The memory 261 shown in FIG. 15 has been stored with the time constant $T_{P1}$, the coefficient $a_{P1}$, etc. as parameters.

Since aberrations other than the above-described correctable aberrations are also aggravated because of the absorption of illuminating light, even if the image-forming characteristics are corrected by the sub-control system 224, they become degraded at a certain point of time during exposure to such an extent that exposure cannot be carried out any longer. Therefore, in some conventional exposure apparatuses, a predetermined energy limit is provided, and the projection optical system PL is adapted not to absorb illuminating light in excess of the energy limit. Among aberrations, those which can be corrected (in this embodiment, astigmatism, spherical aberration, etc.) also depend on various conditions, including the pupil filter 230A. Therefore, the energy limit is also previously obtained by experiment, simulation, etc. and corrected according to the conditions in actual use in the same way as in the case of the other parameters. By doing so, exposure can be carried out under even more accurate image-forming characteristic conditions.

The dotted-line curves 244 and 246 in FIGS. 20(*a*) and 20(*b*) show the way in which exposure is carried out under favorably corrected image-forming characteristic conditions. In FIGS. 20(*a*) and 20(*b*), La and Lb each represent the amount of shift ΔF of the best focus plane position at the above-described energy limit. Assuming that other aberrations show similar change characteristics as the best focus plane position changes which are represented by the curves in FIGS. 20(*a*) and 20(*b*), it is not necessary to calculate change characteristics for the other aberrations in particular, provided that limit values for these aberrations have previously been determined in terms of the amount of change of the best focus plane position. However, change characteristics of the other aberrations may be calculated separately, as a matter of course. In the case of the solid-line curve 243, the amount of shift ΔF is below the limit LA at all times, and there is therefore no problem. However, when the quantity of incident illuminating light is large (e.g., when the transmittance of the reticle R is high), the amount of shift ΔF changes as far as the limit La, as shown by the dotted-line curve 244. At this time, the exposure apparatus suspends the exposure operation, and resumes the exposure after some time has elapsed. The apparatus repeats this operation, as shown by the latter half of the curve 244, thereby preventing the amount of shift ΔF from exceeding the limit La. In the case of FIG. 20(*b*), an exposure operation is carried out using a limit LB which is different from the limit La. By doing so, exposure can be carried out within a range in which the image-forming characteristics do not degrade in each case, and the exposure operation can be conducted without lowering the throughput (productivity) of the exposure apparatus, which would otherwise occur because of a limit set lower than is required.

Incidentally, when a pupil filter is loaded, unloaded or exchanged, that is, when exposure conditions are changed from one to another as shown in FIGS. 20(*a*) and 20(*b*), the conventional practice is to suspend the exposure operation and resume it after time has elapsed to such an extent that the effect of the absorption of illuminating light becomes ignorable. In contrast, in this embodiment, the conditions are changed in a state where the effect of the absorption of illuminating light remains substantially. In this case, problems arise against the calculation of image-forming characteristics in terms of the absorption of illuminating light, as has already been described: (1) a problem caused by the effect of a heat distribution produced under the conditions before the change of the operating conditions; and (2) a problem caused by overlap of heat distributions produced before and after the operating condition change.

Figure 21:
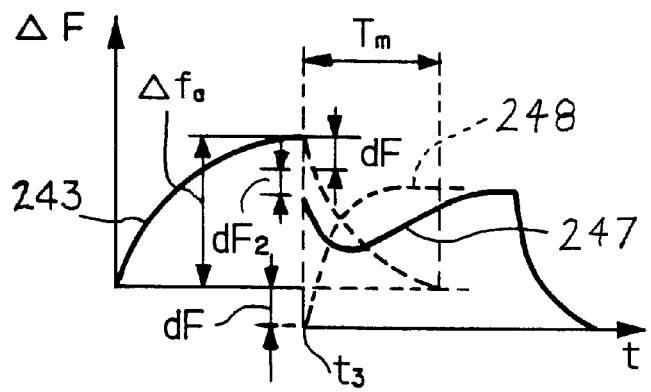
FIG. 21 shows a change in the amount of shift of the best focus plane immediately after the operating condition has been changed between an exposure condition where no pupil filter is present and an exposure condition where a pupil filter is present without providing an exposure suspending condition therebetween.

In the control process for this case, as shown in FIG. 21, the state in which no pupil filter is present continuously changes into a state where a pupil filter is present at time $t_3$. In this case, at time $t_3$ when the pupil filter 230A is inserted, the amount of shift ΔF of the best focus plane position becomes discontinuous. The amount of shift ΔF at this time is the sum of the amount of change dF when there is no absorption of illuminating light and the amount of change $d_{F2}$ resulting from the change of the aberration condition of the projection optical system PL by the absorption of illuminating light. This is the first problem (1). Further, during the period $T_m$ from time $t_3$ in FIG. 21, the effect of decay of the heat distribution under the conditions before the change of the operating conditions and the effect of increase of the heat distribution under the conditions after the operating condition change overlap each other. The effects of decay and increase of the heat distribution cannot readily be calculated as a simple summation. This is the second problem (2).

A first technique of solving the above-described problems has been attained in view of the fact that the above-described problems do not arise as long as there is no effect of the absorption of illuminating light before the operating condition change, as shown in FIGS. 20(*a*) and 20(*b*). That is, according to the first technique, the exposure operation which is to be carried out under the conditions where the pupil filter 230A is inserted is suspended until the illuminating light heat energy absorbed under the conditions where no pupil filter 230A was present has decayed to a certain level. However, if the exposure suspension time is long, the throughput is deteriorated. Therefore, the exposure operation is suspended for a period of time which has previously been determined by experiment or the like so as to be adequate for the heat energy to decay to such an extent that the above-described problems become ignorable from the viewpoint of accuracy.

Figure 22:
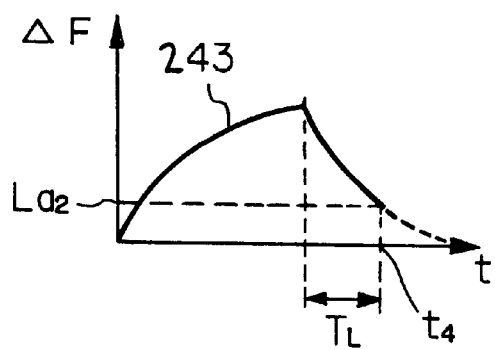
FIG. 22 shows an advantageous effect obtained by providing an exposure suspending condition as an intermediary condition when the operating condition is changed between an exposure condition where no pupil filter is present and an exposure condition where a pupil filter is present.

The control process will be explained below with reference to FIG. 22. Let us assume that the limit for the amount of shift ΔF within which the shift of the best focus plane position is ignorable from the viewpoint of accuracy is limit $La2$. After completion of exposure for a certain process, the exposure operation is suspended for a period $T_L$ in which the amount of shift ΔF becomes less than the limit $La_2$. The limit $La_2$ may be a fixed value. Alternatively, the limit $La_2$ may be changed according to conditions for a subsequent exposure process. By doing so, more precise control can be effected by setting a value for the limit $La_2$ for each set of conditions for a subsequent exposure process. In such a case, the deterioration of the throughput can be minimized. It should, however, be noted that, during the period $T_L$, it is possible to carry out an operation (e.g., alignment operation) other than the exposure operation, for which the accuracy is relatively unimportant.

The second technique is that an offset $dF_2$ for the shift of the best focus plane position, shown in FIG. 21, is obtained by experiment, simulation, etc., and the offset $d_{F2}$ thus obtained is used to correct an image-forming characteristic change. With this technique, the problem (1) is eliminated. Although the problem (2) still remains unsolved, it may be regarded as being so small as to be ignorable-and hence ignored in this case. It should be noted that the actual change of the characteristics is not so large as is shown in the example in FIG. 21, and therefore, no substantial error will occur even if calculation is performed as a simple summation.

Since the amounts of offset $d_{F2}$ under the conditions before and after time $t_3$ differ from each other, experiment must be carried out for each necessary combination. Further, since the value of offset $d_{F2}$ varies according to the amount of illuminating light absorbed, it can serve as a parameter related to the amount of absorption of illuminating light. An example of a simple method for expressing the offset may be such that the value $\Delta Fa$ of the amount of shift $\Delta F$ of the best focus plane position at time $t_3$ is used, and the ratio between the two quantities $(d_{F2}/\Delta Fa)$ is stored in memory as a coefficient. That is, an offset $dF_2$ is obtained on the basis of the amount of shift $\Delta Fa$ of the best focus plane position at time $t_3$ when the operating conditions change, and the correction control is continued by using the offset obtained. With this method, exposure can be continuously carried out without deteriorating the throughput as in the case of the first technique, and it is possible to eliminate the problem which has heretofore been caused when the operating conditions are changed.

In the above-described example, necessary parameters have previously been stored in the main control system 206, and the parameters are changed according to the conditions to thereby cope with a change in the combination of conditions. With this method, however, the process becomes complicated as the number of combinations of conditions increases as in the case of the projection exposure apparatus shown in FIG. 14. Consequently, a great deal of time is needed to adjust the apparatus. To solve this problem, a method may be adopted in which, for example, the best focus plane position, distortion, etc. are measured by a simple and easy method using a spatial image and used for correction. That is, although not shown in FIG. 14, a photoelectric sensor (e.g. a CCD, a light-receiving element having a slit-shaped opening, etc.) is provided, for example, on the wafer stage WS. Light from a reference pattern formed on the reticle is received by the photo-electric sensor, and distortion and magnification are obtained from the position where the light has been received. Then, the position of the best focus plane position is detected from the contrast of the reference pattern. With regard to this technique, various methods have already been known. The control process may be carried out using such a method as follows: After a change of operating conditions, correction is frequently made for a while, and the corrected values are subjected to data processing, thereby obtaining parameters for the main control system 206 under new conditions. After the necessary parameters have been obtained, the measurement is stopped, and correction is made according to the new parameters.

It is also possible to employ a method in which parameters which have been once obtained are all stored in memory, and when exposure is to be carried out under the same conditions, the parameters stored are used. With this method, it is possible to omit the measurement which would otherwise be carried out to obtain parameters when exposure is to be repeated under the same conditions. This method has the advantages that deterioration of the throughput due to the measurement of the spatial image occurs only at the beginning of the process, but thereafter, the correction can be made with the throughput maintained at the ordinary level, and that it is unnecessary to previously obtain parameters under all possible conditions.

It is also possible to employ a method in which parameters are prepared for a particular intensity distribution at the pupil plane of the projection optical system instead of preparing parameters for each set of conditions. More specifically, parameters are prepared in accordance with the form of typical pupil filters at the pupil plane, and parameters for intermediate states are obtained by interpolation. With this method also, it is unnecessary to prepare parameters under all possible conditions, but when a set of conditions is given, parameters are obtained by determining an illuminating light intensity distribution at the pupil plane under the given conditions by calculation or actual measurement, and comparing the obtained intensity distribution with an intensity distribution pattern stored in advance. The stored intensity distribution pattern and the actual intensity distribution may not coincide with each other. In such a case, parameters may be obtained by interpolation or estimation by the fuzzy theory. Examples of methods for obtaining a light intensity distribution at the pupil plane include a method in which a photoelectric sensor is taken in and out of the pupil plane, and a method in which the aperture of the aperture stop 25A is continuously changed above the exposure monitor 27 provided on the wafer stage WS, and the output of the exposure monitor 27 is detected. These methods also make it possible to eliminate the need of previously obtaining parameters for each set of conditions.

Although the present invention has been described through specific terms, it should be noted here that the described embodiments are not necessarily exclusive and that various changes and modifications may be imparted thereto without departing from the scope of the invention which is limited solely by the appended claims.

What is claimed is:

1. A projection exposure apparatus comprising:

a projection optical system having a plurality of optical elements arranged along an optical axis to project an image of a pattern illuminated with light onto a substrate;

a plurality of optical filters of which optical characteristics are different each other, one of the plurality of optical filters being interposed between the pattern and the substrate depending on the pattern; and an adjusting system connected to at least part of the projection optical system having a calculator so that a characteristic of the projected image is adjusted based on a calculation using one of a plurality of parameters corresponding to the optical filters, said one parameter being selected in accordance with the one optical filter to compensate for a change in an optical property of the projection optical system caused by the change of the optical filter.

2. A projection exposure apparatus comprising:

a projection optical system having a plurality of optical elements arranged along an optical axis to project an image of a pattern illuminated with light onto a substrate;

a plurality of optical filters of which optical characteristics are different from each other, one of the plurality of optical filters selected in accordance with the pattern being interposed between the pattern and the substrate; and an adjusting system connected to at least part of the projection optical system, that adjusts a characteristics of the projected image to compensate for a change in an optical property of the projection optical system caused by the change in the optical filter.

3. An apparatus according to claim 2, wherein said adjusting system includes a memory to store a plurality of constants corresponding to said optical filters and selects a constant in accordance with said one optical filter to adjust said characteristic of said projected image based on the selected constant.

4. A projection exposure apparatus comprising:

a projection optical system having an optical member to project an image of a pattern illuminated with light onto a substrate;

a plurality of optical filters of which optical characteristics are different from each other, one of the plurality of optical filters selected in accordance with the pattern being interposed between the pattern and the substrate;

a processor having a memory to store a plurality of parameters corresponding to said optical filters, and that calculates an optical property of the projection optical system using a parameter selected from the memory in accordance with the exchange of the optical filter.

5. A projection exposure apparatus comprising:

a projection optical system having an optical filter and an optical member to project an image of a pattern illuminated with light onto a substrate; and an adjusting system connected to at least part of the projection optical system to adjust an optical property of the optical member in response to a change of the optical filter.

6. A method of exposing a substrate with an image of a pattern illuminated with light through a projection optical system having an optical member, comprising the steps of:

disposing an optical filter between the pattern and the substrate;

changing a parameter for calculating an optical property of the projection optical system in accordance with the optical filter; and adjusting an optical property of the optical member to correct at least one of an image aberration and magnification of the projection optical system based on the optical property calculated using the changed parameter.

7. A method of exposing a substrate with an image of a pattern illuminated with light through a projection optical system having an optical member, comprising the steps of:

disposing an optical filter between the pattern and the substrate;

selecting a constant for correcting an error in an image formation of the pattern, said error being caused by the optical filter; and adjusting an optical property of the optical member to correct at least one of an image aberration and magnification of the projection optical system based on the selected constant.

8. A method of exposing a substrate with an image of a pattern illuminated with light through a projection optical system, comprising the steps of:

disposing an optical filter between the pattern and the substrate;

selecting a parameter from a memory that stores said parameter corresponding to said optical filter to correct an error in an image formation of the pattern, said error being caused by the optical filter; and calculating an optical property of the projection optical system based on the selected parameter.

9. A method of exposing a substrate with an image of a pattern illuminated with light, comprising the steps of:

providing a projection optical system between the pattern and the substrate, the projection optical system having an optical member;

disposing an optical filter between the pattern and the substrate to make light beams passing through first and second portions on the Fourier transform plane of the projection optical system different from each other in phase or transmittance, or to reduce coherence between the light beams; and adjusting at least one of an image aberration and magnification of the projection optical system to compensate for a change in an optical property of the projection optical system caused by the optical filter.

10. A projection exposure apparatus comprising:

an illumination optical system having a plurality of stops that form secondary light sources of which shapes are different from each other to illuminate a pattern with light from a secondary light source formed by a stop selected in accordance with a pattern;

a projection optical system having an optical member and a plurality of optical filters of which optical properties are different from each other to project an image of the illuminated pattern on a predetermine plane through the optical member and an optical filter selected in accordance with the pattern, and an adjusting system connected to at least part of the projection optical system to adjust an optical property of the optical member in accordance with the selected optical filter.

11. A projection exposure apparatus comprising:

an illuminated system having a plurality of optical members to irradiate a mask having a pattern with illumination light from a light source, the illumination system being located between the mask and the light source;

a projection optical system located between said mask and said photosensitive substrate to receive light from the pattern of the mask to project an image of the pattern onto a photosensitive substrate with predetermined image-forming characteristics, said projection optical system comprising an optical member and an optical filter; and an adjusting system that adjusts an image-forming condition of the projection optical system in accordance with an optical characteristic of the optical filter, the adjustment being performed between the mask and the substrate and in accordance with a condition of the light from the pattern of the mask in a Fourier transform place of the projection optical system or in the vicinity thereof.

12. An apparatus to claim 11, wherein the optical filter is selected from a plurality of optical filters which have optical characteristics different from each other.

13. An apparatus according to claim 12 further comprising an aperture system disposed in the optical path of the illumination system for setting an illumination condition of the mask.

14. An apparatus according to claim 11, wherein the adjustment provided by the adjusting system is achieved in response to a change in distribution of the light from the pattern of the mask in the Fourier transform plane of the projection optical system or in the vicinity thereof.

15. An apparatus according to claim 11, wherein the adjustment provided by the adjusting system is achieved in response to a change in coherence of the light from the pattern of the mask taking place in the Fourier transform plane of the projection optical system or in the vicinity thereof between a central portion and a peripheral portion of the light.

16. A method of exposing a photosensitive substrate with light directed from a pattern of a mask, comprising the steps of:

providing a projection optical system having a reflecting optical member and an optical filter arranged between said mask and said photosensitive substrate;

irradiating the mask; and adjusting an image-forming condition of the projection optical system in accordance with an optical characteristic of the optical filter, the adjustment being performed between the mask and the photosensitive substrate and in accordance with a condition of the light from the pattern of the mask in a Fourier transform plane of the projection optical system or in the vicinity thereof.

17. A method according to claim 16, wherein said adjusting step includes a step of adjusting the image-forming condition of the projection optical system in an area which does not include the Fourier transform plane of the projection optical system and the vicinities thereof.

18. A method according to claim 16, wherein said step for irradiating the mask includes a step of setting an illumination condition of the mask by an aperture of a predetermined configuration.

19. A projection exposure apparatus comprising:

an illuminating system having a plurality of optical members to irradiate a mask with illuminating light;

a projection optical system that projects an image of a pattern formed on said mask onto a substrate, said projection optical system disposed between said mask and said substrate;

an optical filter that makes light passing through a partial area centered at an optical axis of said projection optical system and light passing through an area other than said partial area different from each other in phase or transmittance, or for reducing coherence between light passing through said two areas; and a transparent plate having an optical thickness which is approximately equal to that of said optical filter, wherein one of the optical filter and the transparent plate is disposed on substantially a pupil filter of said projection optical system during exposure.

20. An apparatus according to claim 19, further comprising:

a device for adjusting an image-forming condition for said pattern image in accordance with an exchange between said optical filter and said transparent plate.

21. An apparatus according to claim 19, further comprising:

a member for retaining said transparent plate so that said transparent plate is disposed on the pupil plane of said projection optical system or the neighboring plane when said optical filter is taken out of an image-forming optical path of said projection optical system.

22. An apparatus according to claim 1, wherein the one optical filter is disposed in the projection optical system.

23. An apparatus according to claim 1, wherein the plurality of optical filters are supported by a supporting member.

24. An apparatus according to claim 1, wherein the projection optical system comprises a reflecting optical member.

25. An apparatus according to claim 2, wherein the one optical filter is disposed in the projection optical system.

26. An apparatus according to claim 2, wherein the projection optical system comprises a reflecting optical member.

27. An apparatus according to claim 4, wherein the one optical filter is disposed in the projection optical system.

28. An apparatus according to claim 4, wherein the projection optical system comprises a reflecting optical member.

29. An apparatus according to claim 5, wherein the one optical filter is disposed in the projection optical system.

30. An apparatus according to claim 5, wherein the projection optical system comprises a reflecting optical member.

31. A method according to claim 6, further comprising the steps of exposing the pattern onto the substrate using a scanning exposure apparatus.

32. A method according to claim 7, further comprising the steps of exposing the pattern onto the substrate by using a scanning exposure apparatus.

33. A method according to claim 8, further comprising the steps of exposing the pattern onto the substrate by using a scanning exposure apparatus.

34. A method according to claim 9, further comprising the steps of exposing the pattern onto the substrate by using a scanning exposure apparatus.

35. An apparatus according to claim 10, wherein the one optical filter is disposed in the projection optical system.

36. An apparatus according to claim 10, wherein the projection optical system comprises a reflecting optical member.

* * * * *

UNITED STATES PATENT AND TRADEMARK OFFICE
CERTIFICATE OF CORRECTION

PATENT NO. : 6,304,317 B1
DATED : October 16, 2001
INVENTOR(S) : Tetsuo Taniguchi et al.

It is certified that error appears in the above-identified patent and that said Letters Patent is hereby corrected as shown below:

<u>Title page,</u>
Item [30], insert -- Jul. 15, 1993 (JP) .............................. 5-175165 --

Item [75], change "Inventors, Tetsuo Taniguchi, Kawasaki, Naomasa Shiraishi, Yokoyama, both of (JP)" to -- Tetsuo Taniguchi, Ageo-shi; Naomasa Shiraishi, Urawa-shi, both of (JP) --.

Signed and Sealed this

Eleventh Day of June, 2002

*Attest:*

JAMES E. ROGAN
*Attesting Officer*     *Director of the United States Patent and Trademark Office*